United States Patent
Veerasamy et al.

(10) Patent No.: US 8,992,045 B2
(45) Date of Patent: *Mar. 31, 2015

(54) LED LIGHTING SYSTEMS AND/OR METHODS OF MAKING THE SAME

(75) Inventors: Vijayen S. Veerasamy, Ann Arbor, MI (US); Jemssy Alvarez, Gregory, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 519 days.

This patent is subject to a terminal disclaimer.

(21) Appl. No.: 13/188,916

(22) Filed: Jul. 22, 2011

(65) Prior Publication Data
US 2013/0021799 A1 Jan. 24, 2013

(51) Int. Cl.
| | |
|---|---|
| F21S 4/00 | (2006.01) |
| F21V 21/00 | (2006.01) |
| H01L 25/075 | (2006.01) |
| F21V 7/00 | (2006.01) |
| F21V 33/00 | (2006.01) |
| F21S 2/00 | (2006.01) |
| F21V 5/04 | (2006.01) |
| F21V 9/16 | (2006.01) |

(Continued)

(52) U.S. Cl.
CPC .......... *H01L 25/0753* (2013.01); *F21V 7/0083* (2013.01); *F21V 33/006* (2013.01); *F21S 2/005* (2013.01); *F21V 5/045* (2013.01); *F21V 9/16* (2013.01); *F21V 13/04* (2013.01); *F21Y 2101/02* (2013.01); *F21Y 2105/001* (2013.01); *Y10S 362/80* (2013.01)
USPC . 362/249.02; 362/247; 362/241; 362/296.03; 362/800

(58) Field of Classification Search
USPC ............... 362/249.02, 247, 241, 341, 296.03, 362/800; 257/98
See application file for complete search history.

(56) References Cited

U.S. PATENT DOCUMENTS

| | | | |
|---|---|---|---|
| 5,030,594 A | 7/1991 | Heithoff | |
| 5,134,550 A * | 7/1992 | Young | 362/560 |

(Continued)

FOREIGN PATENT DOCUMENTS

| | | |
|---|---|---|
| DE | 103 40 039 | 3/2005 |
| DE | 10 2006 009 694 | 9/2007 |

(Continued)

OTHER PUBLICATIONS

Partial International Search Report dated Oct. 2, 2012.

(Continued)

*Primary Examiner* — Anh Mai
*Assistant Examiner* — Jessica M Apenteng
(74) *Attorney, Agent, or Firm* — Nixon & Vanderhye P.C.

(57) ABSTRACT

Certain example embodiments relate to improved lighting systems and/or methods of making the same. In certain example embodiments, a lighting system includes a glass substrate with one or more apertures. An LED or other light source is disposed at one end of the aperture such that light from the LED directed through the aperture of the glass substrate exits the opposite end of the aperture. Inner surfaces of the aperture have a mirroring material such as silver to reflect the emitted light from the LED. In certain example embodiments, a remote phosphor article or layer is disposed opposite the LED at the other end of the aperture. In certain example embodiment, a lens is disposed in the aperture, between the remote phosphor article and the LED.

23 Claims, 24 Drawing Sheets

(51) Int. Cl.
    *F21V 13/04* (2006.01)
    *F21Y 101/02* (2006.01)
    *F21Y 105/00* (2006.01)

(56) References Cited

U.S. PATENT DOCUMENTS

| | | | |
|---|---|---|---|
| 5,898,267 A | 4/1999 | McDermott | |
| 6,476,551 B1* | 11/2002 | Osawa et al. | 313/506 |
| 6,481,130 B1 | 11/2002 | Wu | |
| 7,557,053 B2 | 7/2009 | Thomsen et al. | |
| 7,700,870 B2 | 4/2010 | Thomsen et al. | |
| 7,786,496 B2* | 8/2010 | Yamazaki et al. | 257/98 |
| 8,029,164 B2* | 10/2011 | Livesay et al. | 362/310 |
| 8,047,675 B1* | 11/2011 | Millikan | 362/241 |
| 8,157,411 B2* | 4/2012 | Tabuchi et al. | 362/241 |
| 2004/0222433 A1 | 11/2004 | Mazzochette et al. | |
| 2006/0169316 A1 | 8/2006 | Thomsen et al. | |
| 2006/0249199 A1 | 11/2006 | Thomsen et al. | |
| 2007/0194465 A1 | 8/2007 | Dai et al. | |
| 2007/0215205 A1 | 9/2007 | Thomsen et al. | |
| 2007/0263390 A1 | 11/2007 | Timinger et al. | |
| 2009/0059586 A1 | 3/2009 | Livesay et al. | |
| 2009/0162667 A1 | 6/2009 | Radkov | |
| 2009/0217978 A1 | 9/2009 | Thomsen et al. | |
| 2009/0219728 A1 | 9/2009 | Hata et al. | |
| 2009/0223252 A1 | 9/2009 | Fulton et al. | |
| 2009/0236618 A1 | 9/2009 | Yasuda | |
| 2010/0079050 A1 | 4/2010 | Kamamori et al. | |
| 2010/0085759 A1 | 4/2010 | O'Sullivan et al. | |
| 2010/0122728 A1 | 5/2010 | Fulton et al. | |
| 2010/0181582 A1 | 7/2010 | Li et al. | |
| 2010/0255980 A1 | 10/2010 | Fulton et al. | |
| 2011/0049749 A1 | 3/2011 | Bailey et al. | |
| 2012/0068615 A1* | 3/2012 | Duong et al. | 315/192 |

FOREIGN PATENT DOCUMENTS

| | | |
|---|---|---|
| EP | 2 196 724 | 6/2010 |
| GB | 247 3840 | 3/2011 |
| WO | WO 02/05357 | 1/2002 |
| WO | WO 2006/105646 | 10/2006 |
| WO | WO 2008/003167 | 1/2008 |
| WO | WO 2011/022610 | 2/2011 |

OTHER PUBLICATIONS

"Freeform Surface Lens for LED Uniform Illumination", Zhenrong et al., 2009 Optical Society of America, Dec. 10, 2009, vol. 48, No. 35/Applied Optics, pp. 6627-6634.
Partial International Search Report dated Oct. 5, 2012.
International Search Reeort dated Oct. 10, 2012.
Dr. Paul A. Magill, "Thermal Management and Heat Rejection for LED Cooling," LED Journal-Online Source for Light Emitting Diode Technology. [retrieved Jul. 22, 2011] http://www.ledjournal.com/eprints/nextreme_sept09.html.
U.S. Appl. No. 12/923,833, filed Oct. 8, 2010, Veerasamy et al.
U.S. Appl. No. 12/923,834, filed Oct. 8, 2010, Veerasamy et al.
U.S. Appl. No. 12/923,835, filed Oct. 8, 2010, Veerasamy et al.
U.S. Appl. No. 12/923,842, filed Oct. 8, 2010, Veerasamy et al.
U.S. Appl. No. 12/926,713, filed Dec. 6, 2010, Alvarez.
U.S. Appl. No. 13/188,897 filed Jul. 22, 2011; Veerasamy et al.
U.S. Appl. No. 13/188,945 filed Jul. 22, 2011; Veerasamy et al.
U.S. Appl. No. 13/188,928 filed Jul. 22, 2011; Veerasamy et al.

* cited by examiner

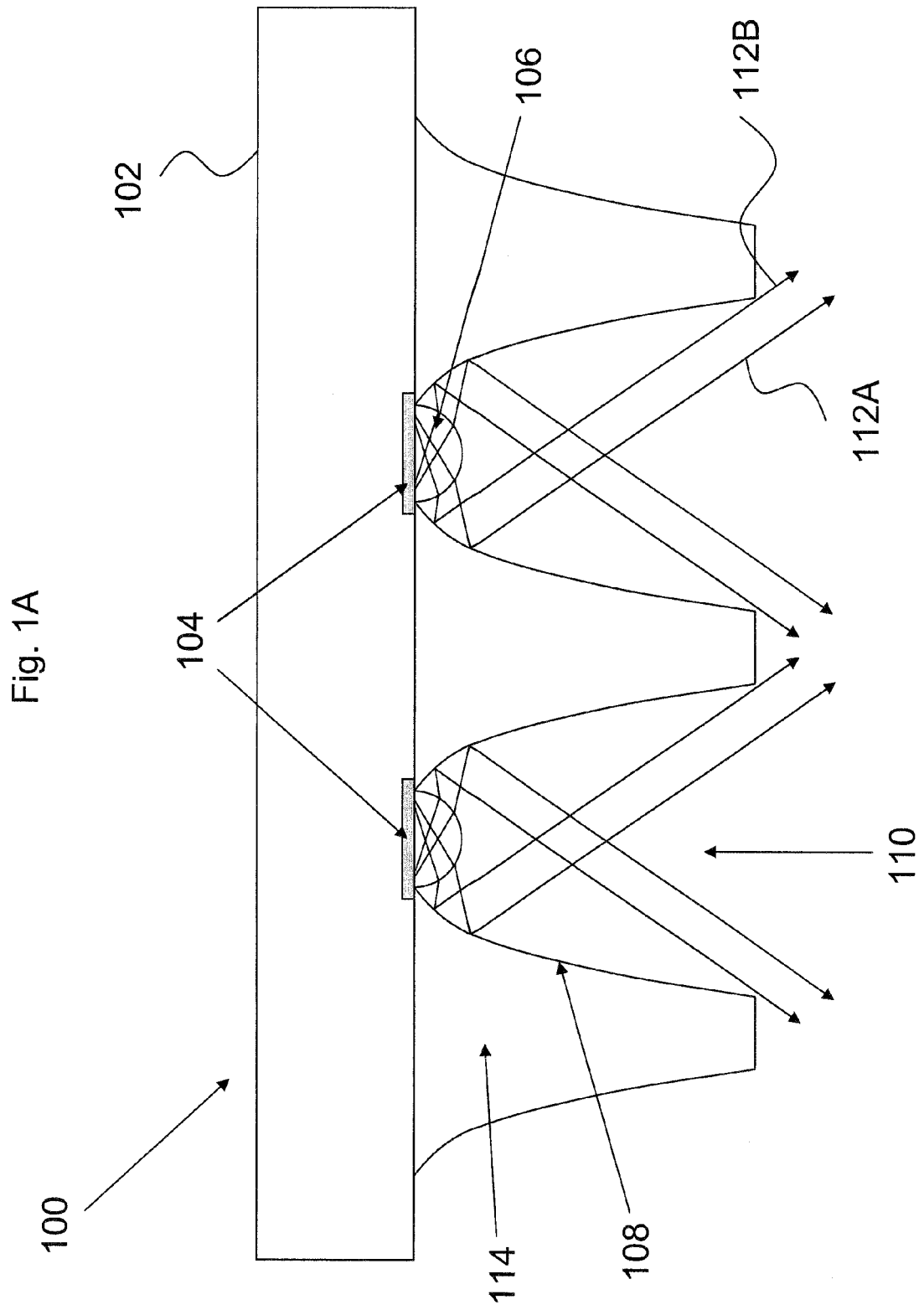

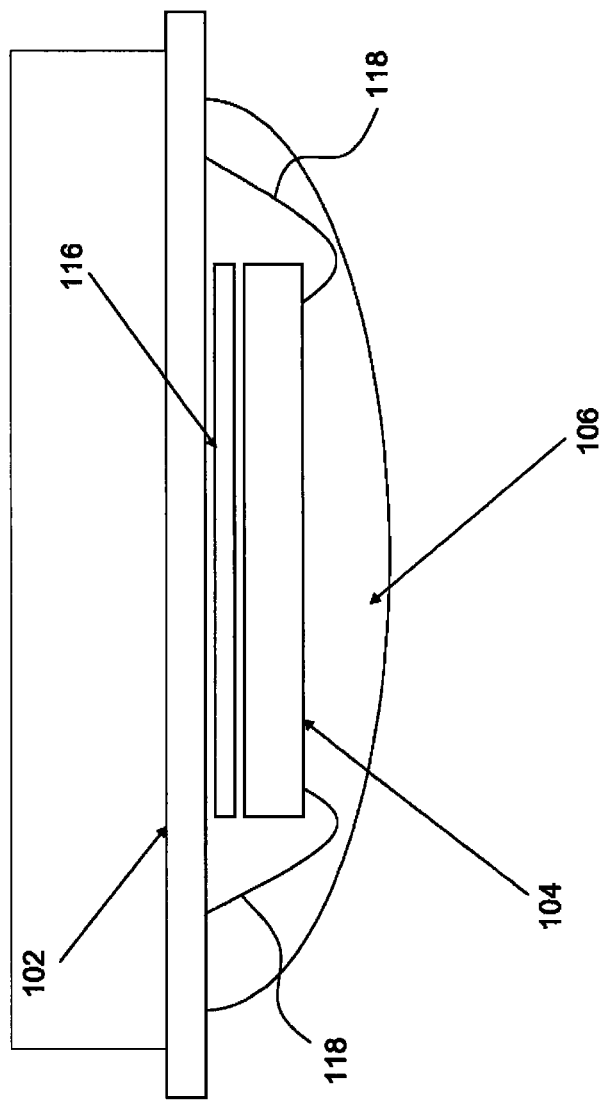

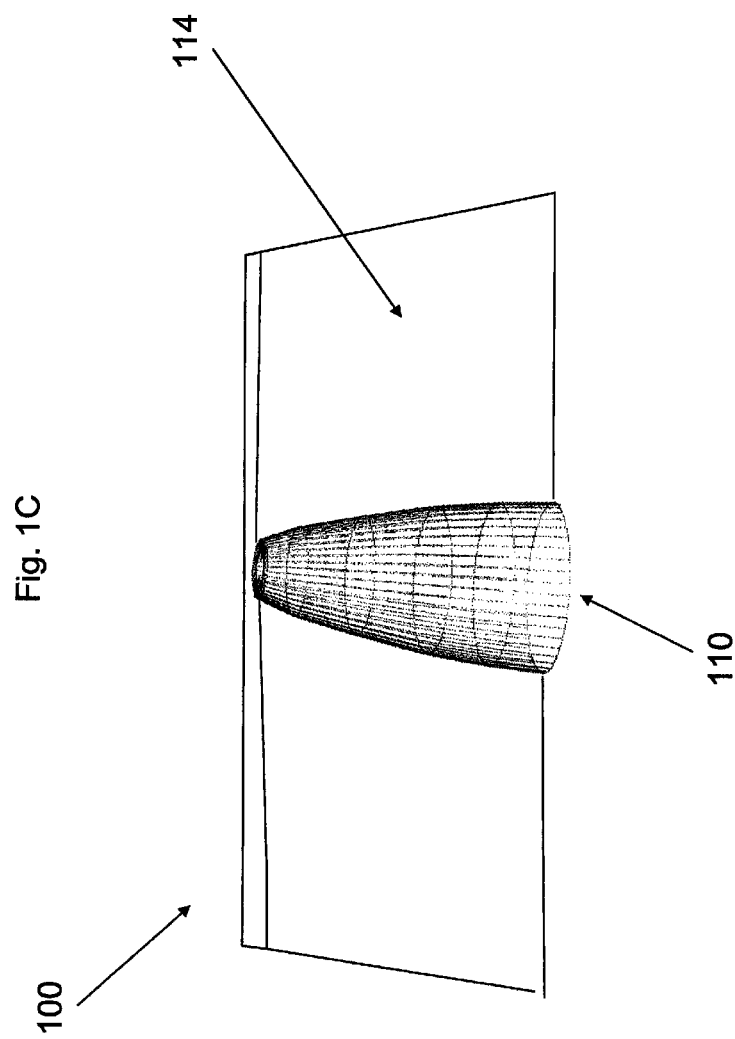

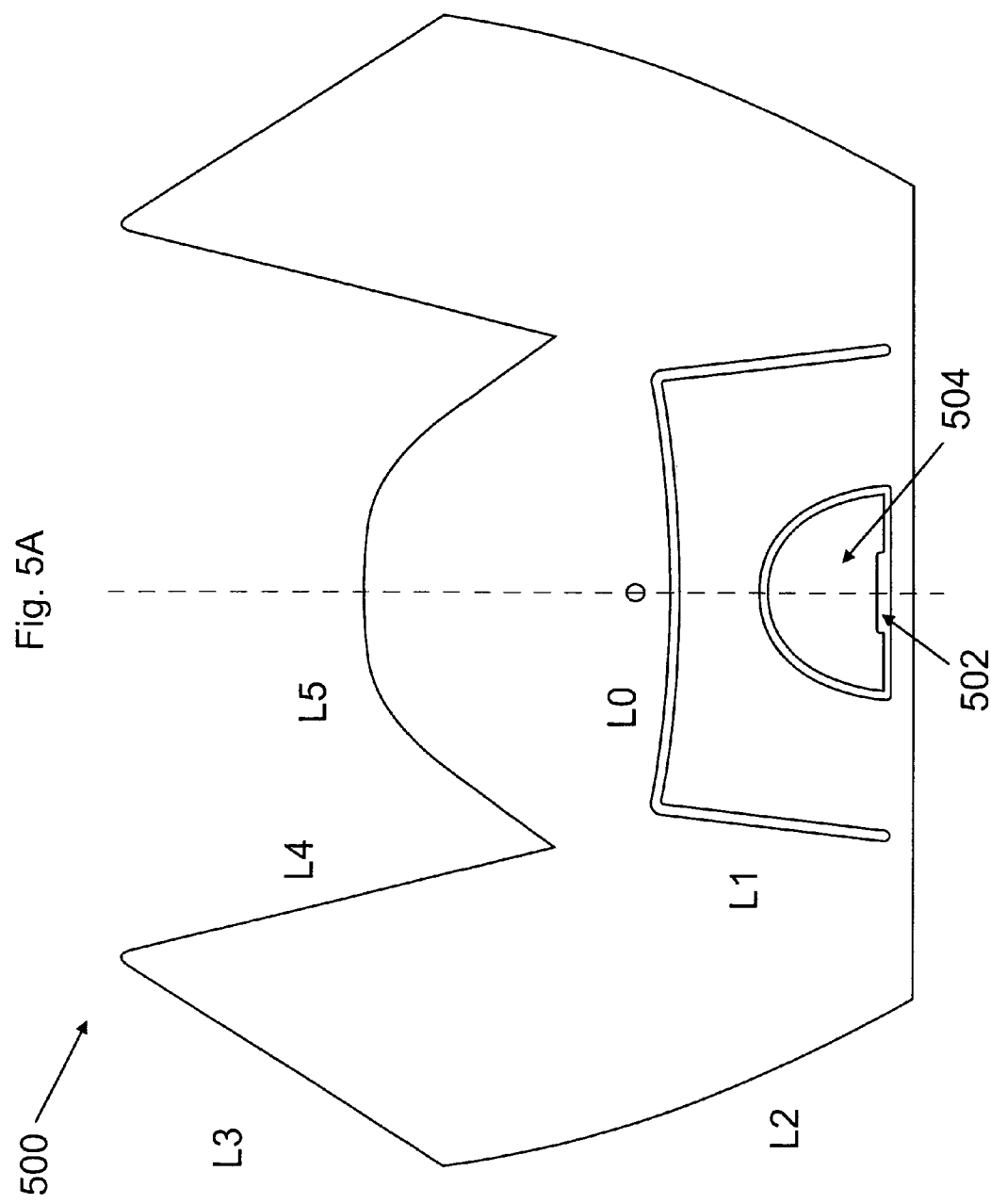

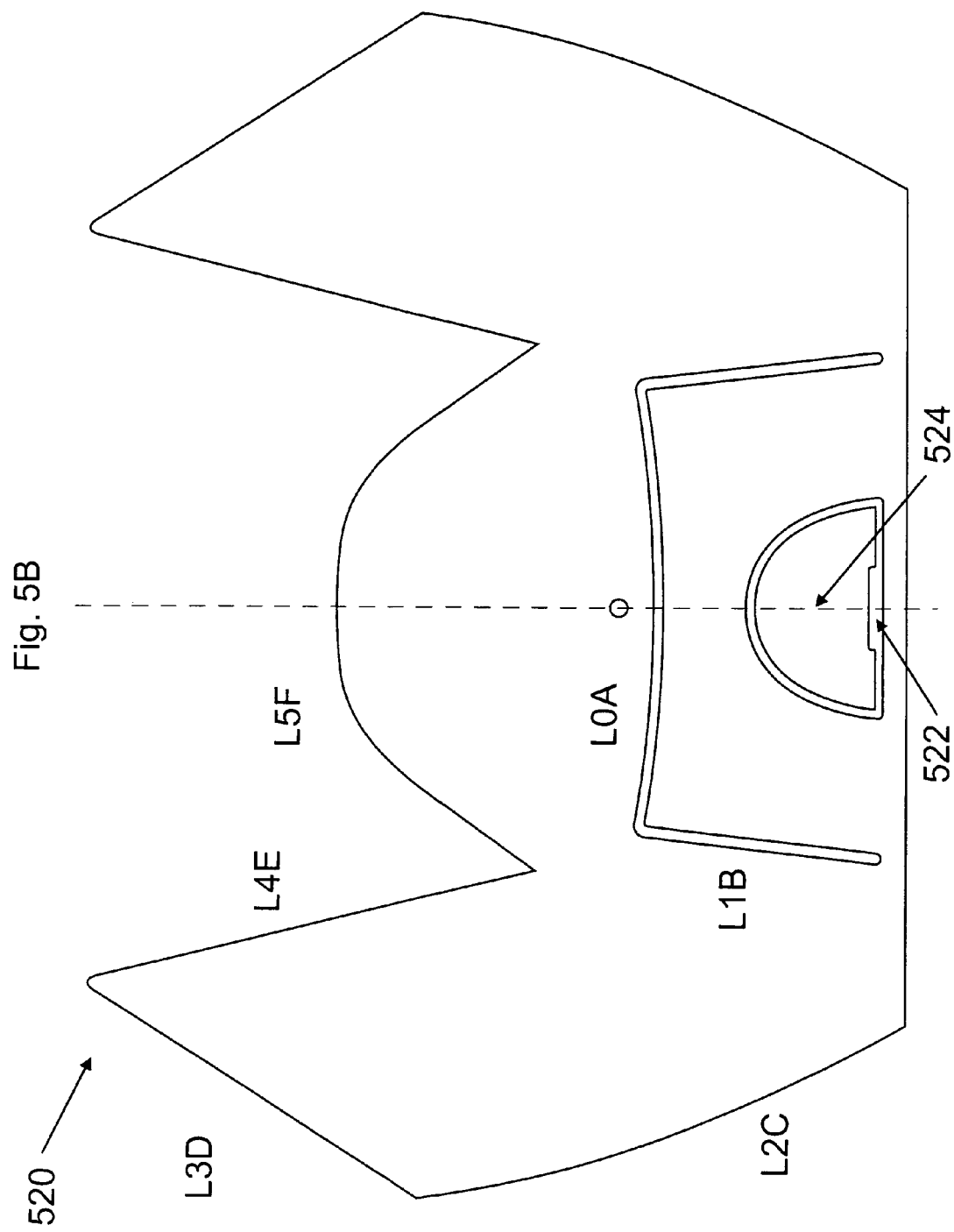

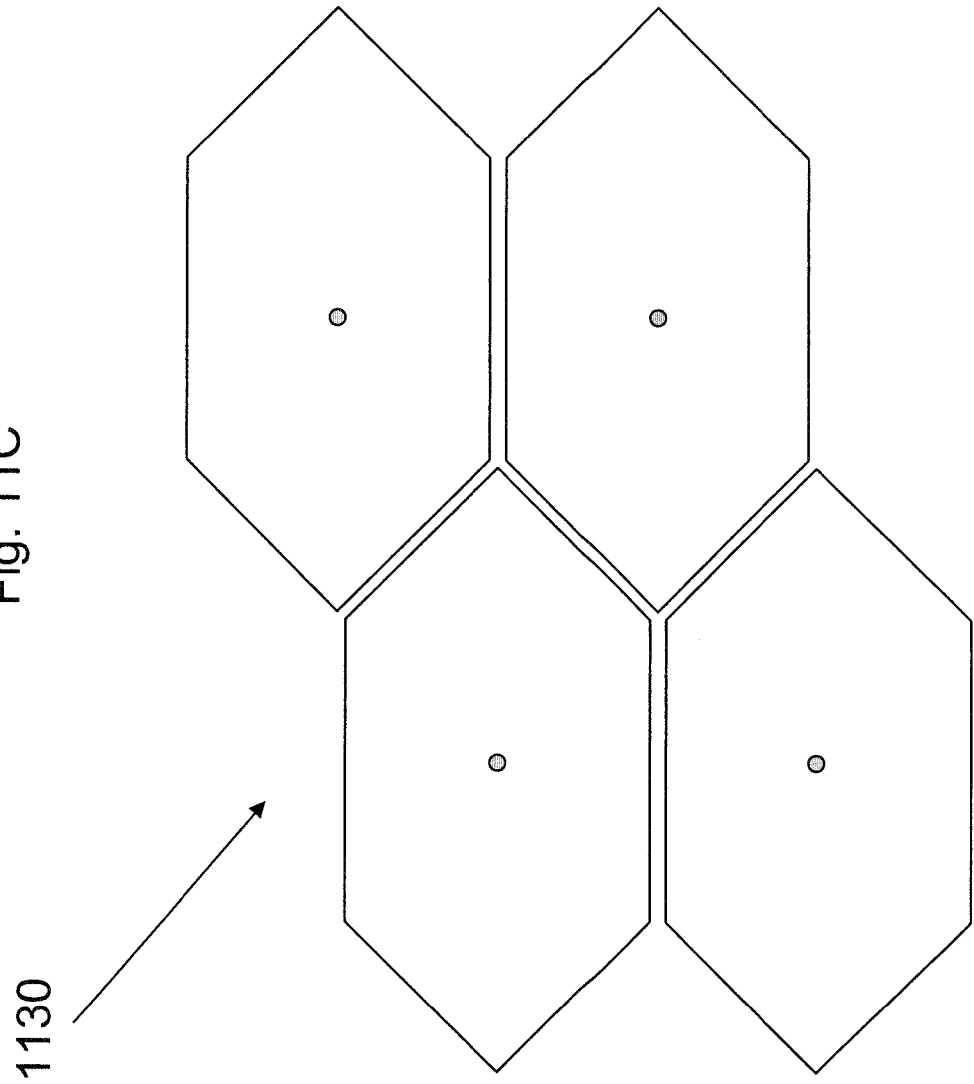

LED LIGHTING SYSTEMS AND/OR METHODS OF MAKING THE SAME

Certain example embodiments of this invention relate to light emitting diode (LED) systems, and/or methods of making the same. More particularly, certain example embodiments relate to improved LED systems with increased light collection and conserved étendue for applications such as lighting luminaires (e.g., fixtures).

BACKGROUND AND SUMMARY OF EXAMPLE EMBODIMENTS OF THE INVENTION

For over a century, incandescent light bulbs have provided a majority of electrically-generated light. However, incandescent light bulbs are generally inefficient at generating light. Indeed, a majority of the power fed into an incandescent light bulb may be converted to heat rather than light.

More recently, light emitting diodes (LEDs), or inorganic LEDs (ILEDs), have been developed. These relatively new light sources have continued development at a fairly rapid pace, with the applicability of certain semiconductor fabrication techniques leading to further increases in lumen output. Accordingly, the combination of increased lumen output with the high luminous efficacy of LEDs may one day make LEDs a preferred lighting choice in certain situations. The adoption of LEDs as a light source may be tied to improvements in various areas that are associated with: 1) cost effective techniques for integrating active materials into device packages, 2) interconnecting devices into modules; 3) managing the accumulation of heat during operation; and/or 4) spatially homogenizing light output to desired levels of chromaticity over a lifetime of a product.

Generally speaking, LEDs have several advantages over incandescent light sources, such as increased durability, longer lifetimes, and reduced energy consumption. In addition, the small nature of LEDs, their narrow spectral emission band, and low operating voltages may one day make them a preferred light source for compact, lightweight, and inexpensive lighting (for example, solid state track lighting systems).

Despite these advantages, however, LEDs also suffer from certain disadvantages. For example, the optical power per unit of an LED's étendue may be significantly lower than a UHP (ultra high performance) lamp. As is known, étendue refers to how spread out light is in a given medium over a given area and a solid angle. This difference may be up to, and sometimes over, a factor of 30. This difference may sometimes create barriers to achieving increased luminance on a target that is a given distance away from the plane of the light source. For example, a typical light source or lamp may only operate to collect 50% of the light emitted from the source.

In certain instances, the efficiency of an LED light source may be adversely affected as a result of the increasing junction temperature associated with the LED. The junction temperature can directly affect the performance and longevity of the LED. As the junction temperature rises, a significant loss of output (luminosity) can be expected. The forward-voltage of an LED may also be dependent on the junction temperature. Specifically, as the temperature rises, the forward voltage decreases. This increase, in turn, can lead to excessive current drain on other LEDs in the array. The draining may result in failure of the LED device. High temperatures can also affect the wavelength of an LED fabricated using gallium arsenide, gallium nitride or silicon carbide.

Conventional cooling systems take advantage of convection, conduction, radiation, etc. to move heat efficiently away from the heat generator. However, in the case of LEDs, there is no infrastructure for heat removal out of the back side of the light source. This may be because conventional light sources may rely on convection from the front side of the light source.

Accordingly, it will be appreciated that new techniques for improving (or better harnessing) light from LED sources are continuously sought after. For instance, it will be appreciated that it may be desirable in certain instances to improve the optical efficiency and/or collimation of light from LED light sources. It will also be appreciated, that new techniques of thermal management for LED light sources are continuously sought after.

One aspect of certain example embodiments of this invention relates to a LED light collection apparatus. This apparatus may be adapted for use, for example, in a compact LED-based track-lighting system.

In certain example embodiments, an array of DC or AC driven LEDs (that may be, for example, chip on board or chip on glass mounted with heat management features) may be provided. In certain example embodiments, a specially designed lens may be used as a collimator in conjunction with apertures (e.g., compound parabolic concentrators) formed in a glass substrate to conserve the étendue of the light source.

In certain example embodiments, non-imaging techniques may be used to tailor surfaces in order to adjust or transform light emitted from a light source (e.g., an LED light source).

In certain example embodiments, an LED may be disposed behind or in an aperture that is formed in a glass substrate. In certain example embodiments, the glass substrate provides the surface to create an array of compound parabolic concentrator (CPC) holes. In certain example embodiments, the glass substrate may be structured to house a fully packaged LED or bare die printed circuit board (PCB) with ancillary heat sinks. In certain example embodiments, a formed glass substrate may house a lens. In certain example embodiments, the glass substrate may allow another glass plate carrying a phosphor component to be remotely spaced away from the LED. In certain example embodiments the LED can be a bare die.

In certain example embodiments, a remote phosphor plate may be used with a Fresnel lens to provide increased diffusion and/or homogenization of emitted light.

In certain example embodiments, a method of making a light fixture is proved. At least one cavity is formed in a glass substrate, the at least one cavity being tapered along a depth thereof so that the at least one cavity increases in diameter or distance from a first end thereof to a second end thereof. A reflective element is disposed on a surface of the at least one cavity. A light emitting diode (LED) is located at or proximate to the first end of each said cavity so as to enable the associated reflective element to reflect at least some light emitted from the respective LED, conserving étendue of the light from the respective LED.

In certain example embodiments, a method of making a light fixture is provided. At least one cavity is formed in a glass substrate, the at least one cavity being tapered along a depth thereof so that the at least one cavity increases in diameter or distance from a first end thereof to a second end thereof. A reflective element is disposed on a surface of the at least one cavity, the reflective element being adapted to reflect at least some light from a light source locatable at or proximate to the first end of each said cavity in order to conserve étendue of the light from the light source.

In certain example embodiments, a method of making a light fixture is provided. A glass substrate having at least one cavity formed therein is provided, the at least one cavity (a) being tapered along a depth thereof so that the at least one cavity increases in diameter or distance from a first end thereof to a second end thereof and (b) having a reflective element disposed on a surface thereof. A light emitting diode (LED) is located at or proximate to the first end of each said cavity so as to enable the associated reflective element to reflect at least some light emitted from the respective LED, conserving étendue of the light from the respective LED.

In certain example embodiments, an apparatus is provided. The apparatus may include a glass substrate having a plurality of cavities formed therein, each said cavity (a) being tapered along a depth thereof so that the at least one cavity increases in diameter or distance from a first end thereof to a second end thereof, and (b) having a reflective element on a surface thereof. The apparatus may include a plurality of light emitting diodes (LEDs) at or proximate to the first end of a respective one of said cavities so as to enable the reflective element of the associated cavity to reflect at least some light emitted from the respective LED, conserving étendue of the light from the respective LED.

In certain example embodiments, a lens is provided. The lens may include: a body portion having a curved upper surface; and first and second flares on opposing sides of the body portion, the first and second flares being symmetrical about an axis of the body portion, wherein each said flare comprises first, second, and third profiles, in which: the first profile being parabolic in shape and curving away from the body portion, the second profile extending generally upwardly and inwardly from an uppermost part of the first profile, the third profile extending between an uppermost part of the second profile and an end of the curved upper surface of the body portion, and an angle is formed with respect to planes extending from the second and third profiles, the angle being approximately 20-50 degrees.

In certain example embodiments, an apparatus is provided. The apparatus may include a substrate having a plurality of cavities formed therein, each said cavity being mirror coated and having a generally parabolic shape in cross section; and a plurality of lenses respectively disposed in the plurality of cavities, each said lens comprising: a body portion having a curved upper surface; and first and second flares on opposing sides of the body portion, the first and second flares being symmetrical about an axis of the body portion, wherein each said flare comprises first, second, and third profiles, in which: the first profile curving away from the body portion and substantially matching the parabolic shape of the cavity in which the lens is disposed, the second profile extending generally upwardly and inwardly from an uppermost part of the first profile, and the third profile extending between an uppermost part of the second profile and an end of the curved upper surface of the body portion.

In certain example embodiments, a method of making a lighting fixture is provided. A plurality of lenses are provided into respective cavities formed in a glass substrate, wherein an LED is disposed at or proximate to each said cavity, wherein each said lens comprises: a body portion having a curved upper surface; and first and second flares on opposing sides of the body portion, the first and second flares being symmetrical about an axis of the body portion, wherein each said flare comprises first, second, and third profiles, in which: the first profile curving away from the body portion and substantially matching a shape of the cavity in which the lens is inserted, the second profile extending generally upwardly and inwardly from an uppermost part of the first profile, and the third profile extending between an uppermost part of the second profile and an end of the curved upper surface of the body portion.

In certain example embodiments, a method of making a lens is provided. Glass or PMMA is casted to a shape that includes: a body portion having a curved upper surface; and first and second flares on opposing sides of the body portion, the first and second flares being symmetrical about an axis of the body portion, wherein each said flare comprises first, second, and third profiles, in which: the first profile being parabolic in shape and curving away from the body portion, the second profile extending generally upwardly and inwardly from an uppermost part of the first profile, the third profile extending between an uppermost part of the second profile and an end of the curved upper surface of the body portion, and an angle is formed with respect to planes extending from the second and third profiles, the angle being approximately 20-50 degrees.

In certain example embodiments, a lens may collect, concentrate, and/or collimate light emitted from the LED.

In certain example embodiments, an apparatus is provided where the apparatus may include a first glass substrate having at least one cavity formed therein, each said cavity (a) increasing in diameter or distance from a first end thereof to a second end thereof, and (b) having a reflective surface; at least one light emitting diode (LED) at or proximate to the first end of a respective one of said cavities so as to enable the reflective surface of the associated cavity to reflect at least some light emitted from the respective LED; and a phosphor-inclusive material disposed over the at least one LED and over the first end.

In certain example embodiments, a method of making a lighting fixture is provided. At least one cavity is formed in a glass substrate, each said cavity increasing in diameter or distance from a first end thereof to a second end thereof. A reflective element is disposed on a surface of the at least one cavity. A light emitting diode (LED) is located at or proximate to the first end of each said cavity so as to enable the associated reflective element to reflect at least some light emitted from the respective LED. A phosphor-inclusive material is disposed over the first end.

In certain example embodiments, a method of making a light fixture is provided. At least one cavity is formed in a glass substrate, the at least one cavity being tapered along a depth thereof so that the at least one cavity increases in diameter or distance from a first end thereof to a second end thereof. A reflective element is disposed on a surface of the at least one cavity, the reflective element being adapted to reflect at least some light from a light source locatable at or proximate to the first end of each said cavity in order to conserve étendue of the light from the light source. A collimating lens is disposed within each said cavity, the reflected light exiting the second end of each said cavity is substantially collimated so as to allow for 10-30 degrees of distribution. A phosphor-inclusive material is disposed over the first end.

In certain example embodiments, a lighting system may be provided that includes the apparatus. In certain example embodiments, a lighting system may be provided with a plurality of interconnected apparatuses.

In certain example embodiments, there is provided a phosphor assembly adapted for use with a lighting apparatus that includes at least one light source, the assembly, moving away from the light source, comprising: a first glass substrate; a first index layer; a phosphor component; a second index layer; and a second glass substrate. Emitted light from the at least one light source is partially refracted between the first and second index layers such that at least some of the emitted light passes multiple times through the phosphor component. The indices of refraction for the first and second index layers substantially match one another and are selected in dependence of the phosphor component material.

In certain example embodiments, there is provided an apparatus that includes a tile. The tile includes at least a first glass substrate having at least one cavity formed therein, each said cavity (a) increasing in diameter or distance from a first end thereof to a second end thereof, and (b) having a reflective surface. The tile also may include at least one light emitting diode (LED) at or proximate to the first end of a respective one of said cavities so as to enable the reflective surface of the associated cavity to reflect at least some light emitted from the respective LED. The tile further may include an active thermal management system or layer disposed proximate to the at least one LED, such that the LED is between the active thermal management system or layer and the second end, the active thermal management system or layer being configured to variably transfer heat from a first side of the active thermal management system or layer to a second side of the active thermal management system or layer, the first side being closer to the at least one LED than the second side. A thermal controller may be coupled to the active thermal management system or layer, with the thermal controller being configured to sense a temperature associated with the at least one LED and/or the active thermal management system or layer, and to control the variably transferred heat of the respective active thermal management system or layer based the sensed temperature control.

In certain example embodiments, the apparatus of claim comprises a plurality of the tiles, wherein tiles in the plurality are interconnected. In certain example embodiments, the temperature controller may be adapted to control the flow of heat proximate to some or all of the LEDs, tiles, and/or the active heat system.

In certain example embodiments, a method of making a light fixture is provided. At least one cavity is formed in a glass substrate, each said cavity increasing in diameter or distance from a first end thereof to a second end thereof. A reflective element is disposed on a surface of the at least one cavity. A light emitting diode (LED) is located at or proximate to the first end of each said cavity so as to enable the associated reflective element to reflect at least some light emitted from the respective LED. An active thermal management system or layer is disposed proximate to each one of the located LEDs, where the respective LED is between the active thermal management system or layer and the first end, the active thermal management system or layer being configured to variably transfer heat from a first side of the active thermal management system or layer to a second side of the active thermal management system or layer, the first side being closer to the respective LED than the second side. A thermal controller is coupled to at least the active thermal management systems or layers, the thermal controller being configured to sense a temperature associated with the at least one LED and/or the active thermal management system or layer, and to control the variably transferred heat based the sensed temperature control.

The features, aspects, advantages, and example embodiments described herein may be combined in any suitable combination or sub-combination to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 1A is an illustrative cross-sectional view showing an exemplary lighting fixture according to certain example embodiments;

FIG. 1B is an illustrative cross-sectional view of a portion of the cross-sectional view of FIG. 1A;

FIG. 1C is an illustrative rendering of an exemplary lighting fixture;

FIGS. 5A-5B are illustrative cross-sectional views of example lenses according to certain example embodiments;

FIGS. 11A-11C are diagrams of example lighting luminaires according to certain example embodiments;

DETAILED DESCRIPTION OF EXAMPLE EMBODIMENTS OF THE INVENTION

Figure 2:
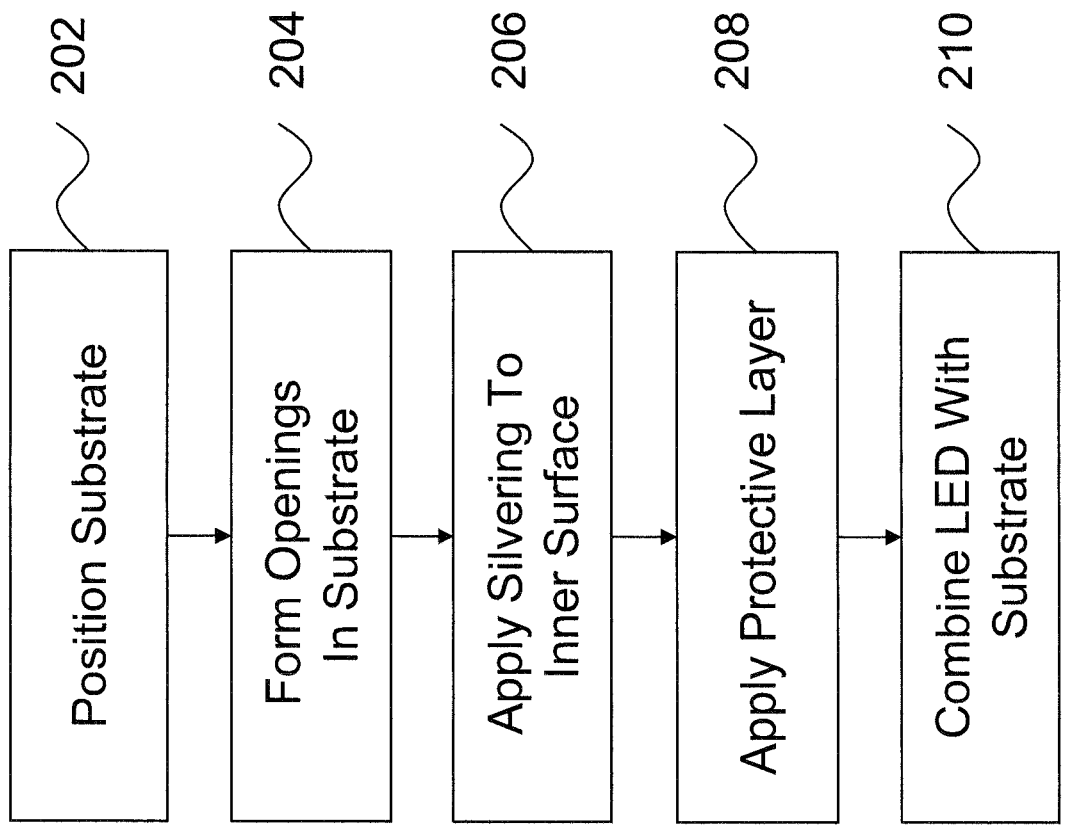
FIG. 2 is a flowchart of an example process for creating a lighting fixture according to certain example embodiments.

The following description is provided in relation to several example embodiments which may share common characteristics, features, etc. It is to be understood that one or more features of any one embodiment may be combinable with one or more features of other embodiments. In addition, single features or a combination of features may constitute an additional embodiment(s).

Certain example embodiments relate LED devices where the étendue is conserved and the emitted light is collimated. In certain example embodiments, a lighting apparatus may operate to prevent an excess "waste" of lighting and thereby increase the efficiency of the lighting apparatus.

FIG. 1A is an illustrative cross-sectional view showing an exemplary lighting fixture according to certain example embodiments. In FIG. 1B, an enlarged cross-sectional view of a portion of luminaire 100 from FIG. 1A is shown. Light fixture (or luminaire) 100 includes a printed circuit board (PCB) 102 that is used to house the LEDs 104. In this embodiment, the PCB 102 is used to mount the LEDs 104 based on a chip on board (COB) technique. However, other types of LED configurations may also be used. For example, LEDs in standard cylindrical structures (e.g., encompassed by a plastic cocoon) may be used. Alternatively, surface mounted device (SMD) LEDs may be used. However, as indicated above, in the FIG. 1 example embodiment, the LEDs are mounted via a COB technique. Accordingly, the LEDs 104 may be provided in the form of a semiconductor chip. These chips may then be disposed on or otherwise affixed to a PCB. The COB technique of providing LEDs may allow for increased flexibility when designing LEDs according to certain example embodiments.

As shown perhaps best in FIG. 1B, the PCB 102 and the LED 104 are connected via a thermally conductive adhesive 116. For example, the LED 104 disposed on the PCB 102 is thermally coupled to a thermo-electric cooler (TEC) chip on the PCB 102 with the use of thermally conductive graphene coatings on copper. In certain example embodiments, a passive heat sink may be used to conduct heat away from the back of the PCB containing the excitation LED's and/or driving circuitry of a device. In certain example embodiments, a PCB may include copper interconnects and/or pads that are bound (e.g., via thermal glue) to a dedicated heat sink (e.g., 102) at the back of the PCB (e.g., 104).

Connections 118 allow for current to flow between the PCB 102 and the LED 104. An enclosure (e.g., a sealing compound) may also be used to isolate and/or seal the LED and/or PCB and associated materials away from the outside environment. In certain example embodiments, the thermally conductive adhesive 116 may also help serve as a protective encapsulating coating. The PCB 102 may include multiple LEDs (e.g., as shown in FIG. 1A). In certain example embodiments, driver chips and/or an ancillary thermal management system may also be included in/with a PCB.

In certain example embodiments, this arrangement may provide increased-power densities during operation of the LED. Also, this arrangement may provide for increased response times in scalable millimeter sized chips that are suitable for thermal management for LED/ILED applications. Because of the high-power density and small thermal mass, the response times may be fast and be able to facilitate on demand and independent temperature control per LED device. Certain example embodiments may have an output of about 160×16 lumens/watt per of LEDs over long duration of time.

Still referring to FIG. 1A, the LEDs 104 and the associated PCB 102 are disposed on or with a glass substrate 114 that has been formed to include one or more apertures 110 that may function as, or similar to, a compound parabolic concentrator (CPC). An example process for making such structures in the glass is described in greater detail below. The apertures are formed with sides 108 that are structured to reflect light 112A and 112B emitted from the LEDs 104. As shown in FIG. 1A light rays 112A and 112B may be substantially parallel to one another (e.g., collimated) upon exiting the aperture 110.

Figure 8:
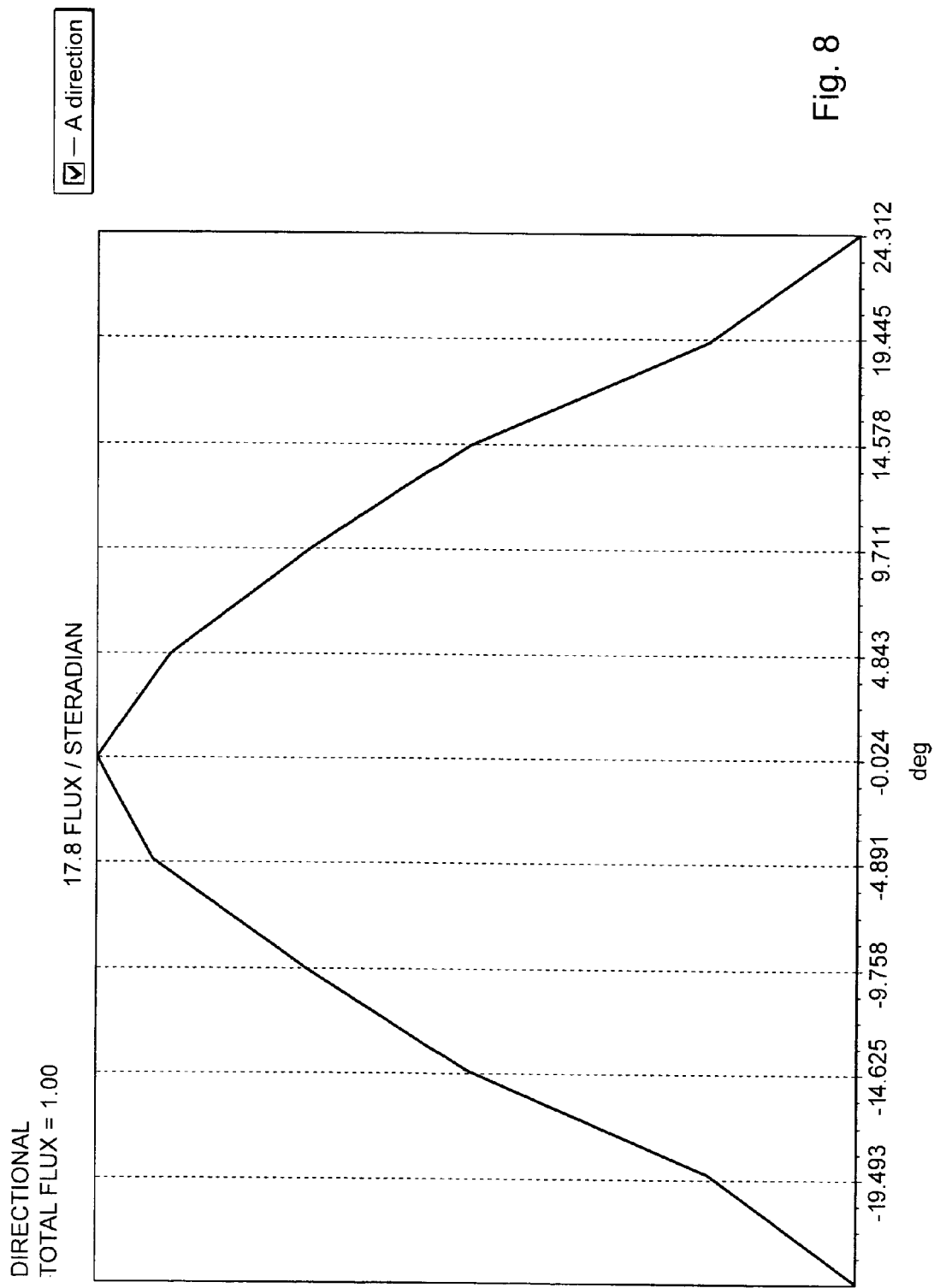
FIGS. 8-9 show example lighting profiles for an exemplary collimator according to certain example embodiments.
Figure 9:
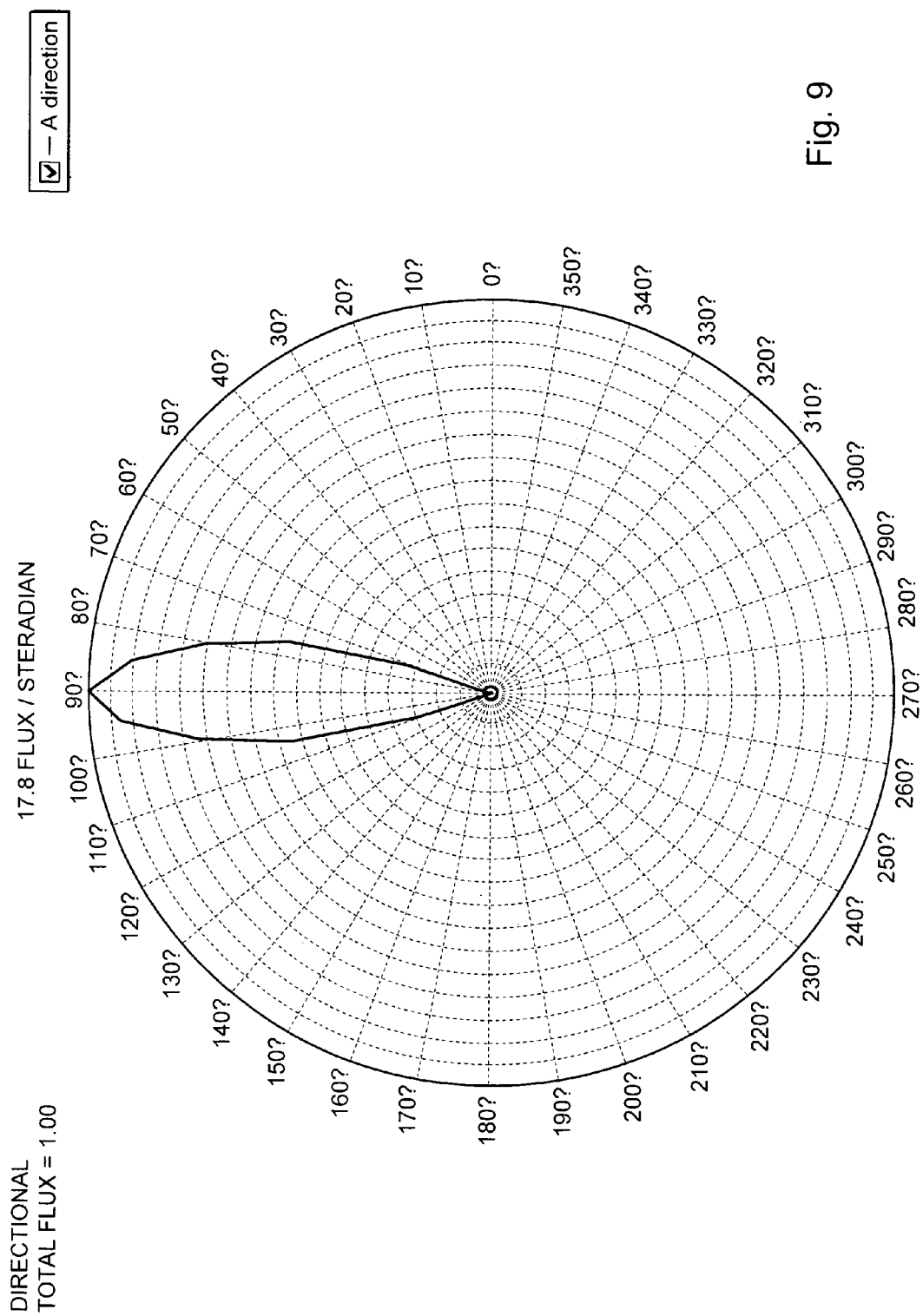

FIG. 1C is an illustrative rendering of the exemplary lighting fixture of FIG. 1A (showing one of the apertures 110). FIGS. 8-9 show example lighting profiles for the illustrative lighting fixture shown in FIG. 1C according to certain example embodiments. It will be appreciated that the étendue may be conserved by virtue of the parabolic cross-sectional shape of the cavities, e.g., compared to a situation where the light is output from a simple LED.

FIG. 2A is a flowchart of an example process for creating a lighting fixture according to certain example embodiments. A substrate is provided and/or positioned in step 202. In a preferred embodiment, the substrate may be glass substrate. For example, soda-lime-silica base glass may be used. In certain example embodiments, the provided glass substrate may have a thickness of between 5 mm and 100 mm, more preferably between about 10 mm and 50 mm, and even more preferably about 20 mm. Glass may have certain advantages over other types of materials. For example, glass may have increased scratch resistance and/or flexural strength. These properties may be combined with the ability of glass to be chemically tempered and/or to maintain an optical surface finish such that glass may be able to help sustain a silvered or otherwise coated mirror over a long period of operation. Additionally, glass may less susceptible to yellowing from UV rays and may be able to sustain high operational temperature for phosphor coating heat treatment (described in greater detail below) for crystallization. Further, the expansion coefficient of glass is generally decreased relative to most plastics. This may facilitate the bonding of the PCB to a glass substrate because of the increased tolerance to expansion effects for a large luminaire array (and thus a large piece of glass).

While glass may be a preferred embodiment (e.g., glass may not yellow or degrade under illumination from blue light, for example at or around 460 nm, or other light from UV LEDs), certain example embodiments may use other types of substrates (e.g., substrates that are stable to being exposed to blue or other colored light). For example, certain example embodiments may use substrates that include a plastic or ceramic material. Certain example embodiments may use a combination of different material types. For example, part of the substrate may be glass and part may be ceramic, plastic, metal, etc.

Referring once again to FIG. 2A, once the substrate is provided, in step 204, one or more openings or apertures may be formed in the substrate. The formation of the opening may include multiple sub-steps. For example, a water jet may be used to form an initial aperture in the glass substrate. After making an initial opening, a drill may then be applied to refine the newly created opening to more precisely form a desired shape. As discussed above, the shape of the apertures may be similar to or based on a compound parabolic concentrator. In constructing such a generally conically shaped cavity, it will be appreciated that other similar techniques may be used to form the cavities. For example a drill may be used without the assistance of the water jet. Other example embodiments may use only the water jet and/or other techniques to form the openings in the glass. Certain example embodiments may use a mold to initially form the aperture/opening when the substrate is being initially prepared. In certain example embodiments, $CO_2$ or other laser cutting may be used to cut the holes in the glass.

Figure 7:
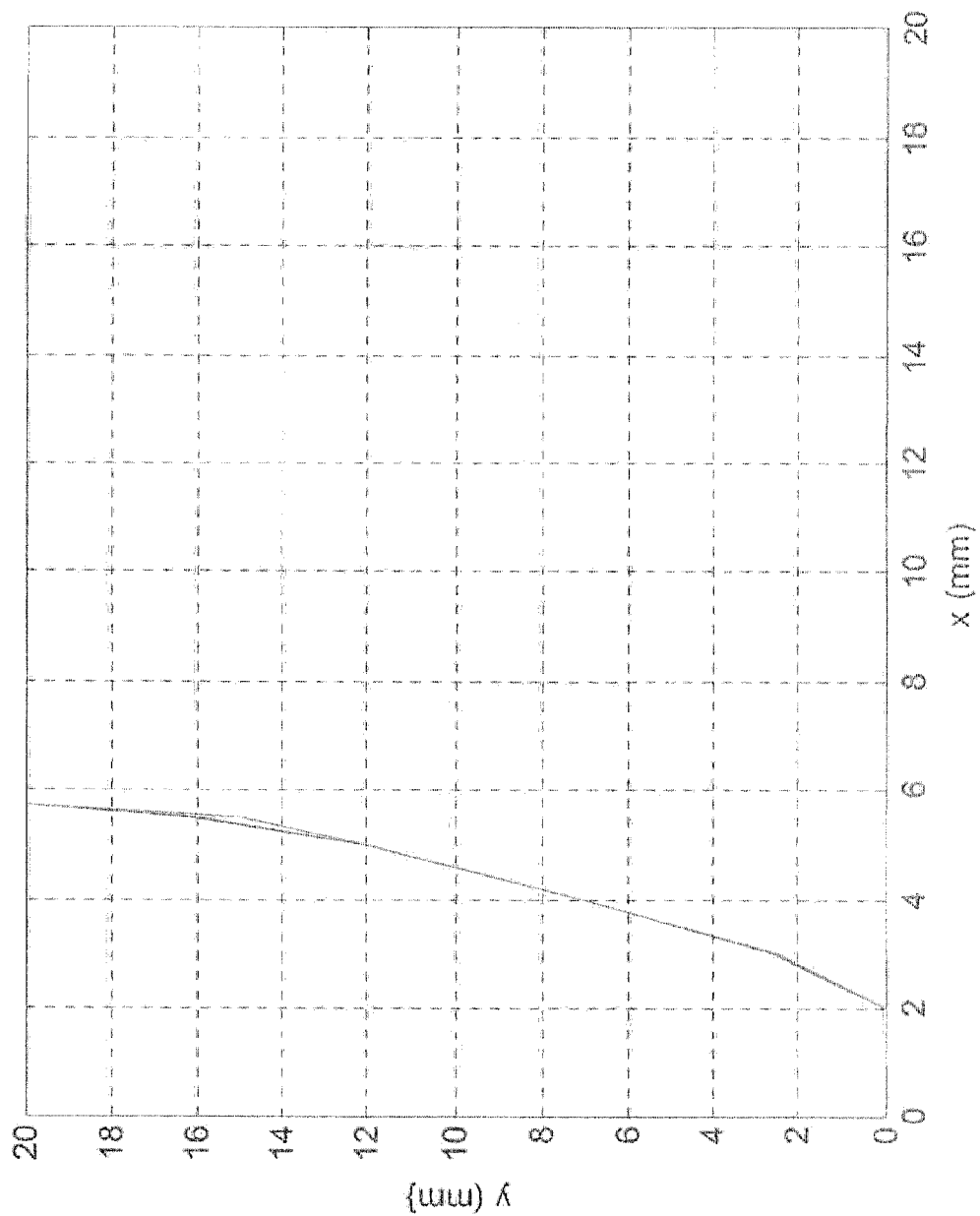
FIG. 7 is a half-cross-sectional view showing example dimensions of a portion of an exemplary light fixture according to certain example embodiments.

FIG. 7 is a half-cross-sectional view showing example dimensions of a portion of an exemplary cavity according to certain example embodiments. Accordingly, certain example embodiments may use glass substrates that are approximately 20 mm thick with openings being formed at a similar depth. The openings may be formed with about a 12 mm diameter portion at one end and a 4 mm diameter open portion at the apex end. In certain example embodiments, the depth and/or width of the openings may be adjusted based on the particulars of a given application. For example, a relatively short depth of 5 mm may be used with the apex of 1 mm where the opening away from the LED is about 4 mm in diameter. Thus, the openings may be between at least about 5 mm and 50 mm in depth and have varying widths of between 1 mm and 25 mm. The openings may be generally arcuate in shape, e.g., as modeled by a quadratic expression. In certain example embodiments, the depth of a cavity may be shallower than the thickness of the glass substrate. Certain example embodiments may use the following equation to determine/define a profile (e.g., an inner profile of a lens): $y=0.0335-0.6198x+4.5946x^2-17.5060x^3\,37.1804x^4-40.8119x^5+17.1293x^6$ for 2 mm≤mod x≤6 mm; and y=0 for mod x≤2.

After forming the opening in step 204, the surfaces have a mirror coating (e.g., a thin-film material) disposed thereon in step 206. This may mirror the inside surfaces (e.g., surface 108 in FIG. 1A) such that in use light is reflected off of the inner surface of the opening. Furthermore, as shown in FIG. 1A the aperture and the reflecting material may operate to increase the collimation of light rays emitting from an LED at the apex of the opening. In certain example embodiments, the coating applied to the inner parabolic surface (e.g., 108) may be done through a wet process of silver mirroring (e.g., through application of Ag to the surface). The silvering process may use standard application techniques (e.g., as are use in creating mirrors). Of course, it will be appreciated that other reflective coatings may be applied. In addition, or the alternative, multilayer mirror coatings may be used in certain example embodiments. For instance, in certain example embodiments, a protective layer (e.g., of a silicon-inclusive material such as silicon oxide, silicon nitride, or silicon oxinitride) may be disposed above or below the mirror coating.

The mirror coating may be protected with an optically "clear" material in step 208, e.g., in order to form a protective layer over the applied mirror. Certain example embodiments may use a protective mirror coating that includes, for example, a silicate, a wet-applied sol gel type coating, a very dense layer that is atomic layer deposition (ALD) deposited, a polymer, an epoxy, a resin, and/or the like.

The glass substrate with the formed reflectors may be combined with an LED in step 210. The LED may be mounted behind and/or in the glass substrate such that light from the LED is directed into the created cavity (e.g., at the position shown in FIG. 1A). The light emitted from the LED may then conserve étendue and/or have an increased collimation, e.g., as a result of the mirrored sidewalls.

In certain example embodiments, multiple LEDs may be used in conjunction with one or more cavities. For example, four LEDs arranged in a pattern may be disposed in one or more cavities. Accordingly light from the four LEDs may be directed out from the one or more cavities. In other words, in certain example embodiments, a one-to-one mapping between LEDs and cavities may be provided, whereas different example embodiments may involve a many-to-one mapping between LEDs and a single cavity.

Figure 3A:
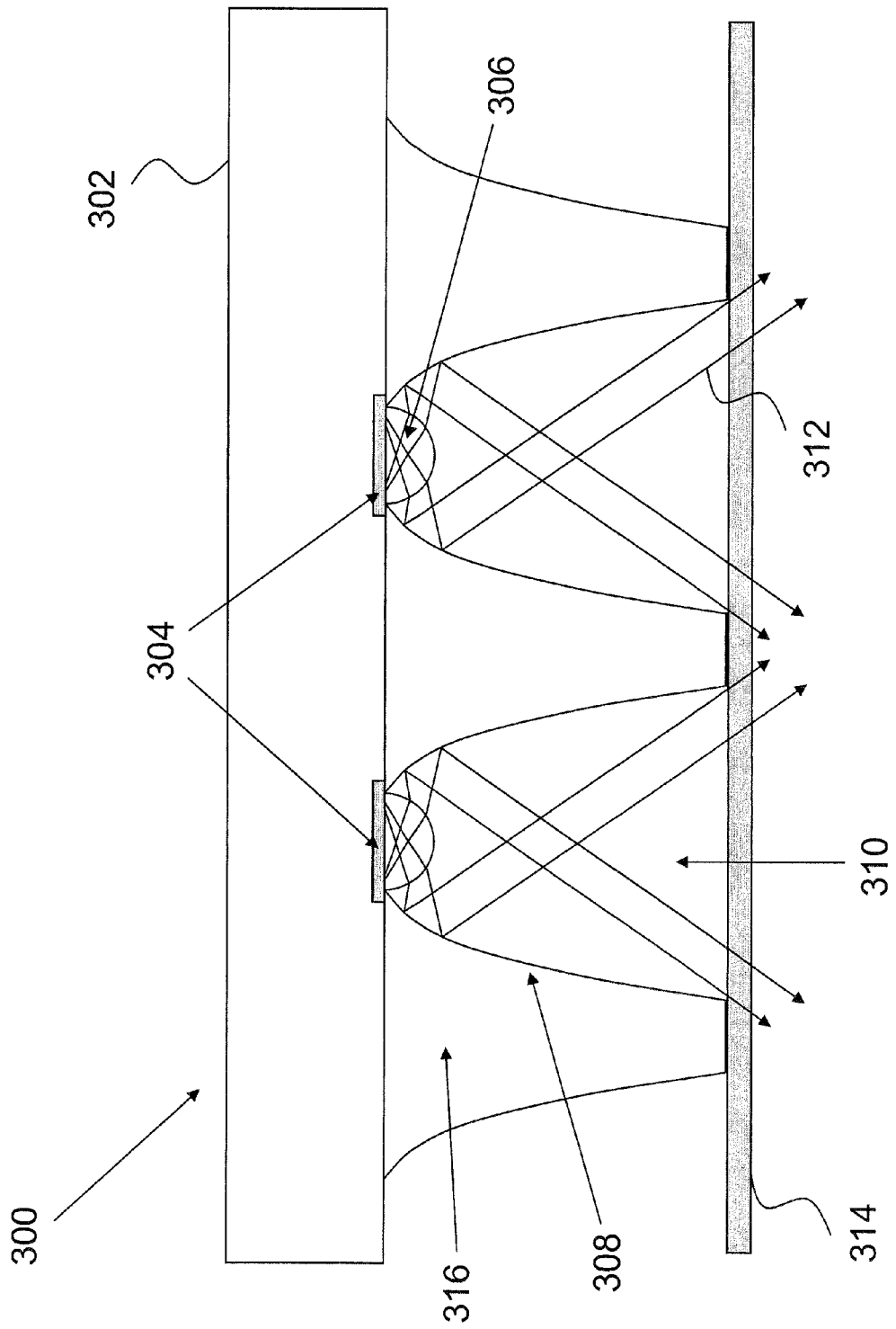
FIG. 3A is an illustrative cross-sectional view showing another exemplary lighting fixture according to certain example embodiments.

FIG. 3A is an illustrative cross-sectional view showing another exemplary lighting fixture according to certain example embodiments. Lighting luminaire 300 may be similar in certain respects to the lighting luminaire 100 shown in FIG. 1A. A PCB 302 may be connected to LEDs 304. In certain example embodiments, the LEDs may be encompassed by a protective seal 306. The PCB 302 and/or the LEDs may be disposed on or with a glass substrate 316 that may include multiple apertures or openings 310. The openings may, in turn, have reflective parabolic surfaces 308 that operate to reflect emitted light 312 from the LED 304 with increased collimation. In this example embodiment, a phosphor layer or plate 314 may be provided. In certain example embodiments, the phosphor layer or plate 314 may be spacedly disposed from the LEDs 304 and/or the PCB 302. For example, a separate substrate may support a phosphor layer, and the separate substrate may be disposed over surfaces on a side of the LEDs 304 opposite the PCB 302 (e.g., in or on the patterned glass substrate 316).

In certain example embodiments, phosphors may be included in an epoxy cap of individual LEDs (e.g., seal 306). However, in certain instances, this epoxy cap and the phosphors therein may create inefficiencies in light transmission and/or the operation of the LED. Furthermore, the epoxy may be prone to yellowing. Accordingly, as indicated above, certain example embodiments may use a glass superstrate that has an embedded or coated phosphor.

Other techniques for disposing of the phosphor layer may also be used. For example, the phosphor may be layered on top of the glass substrate (e.g., through a sputtering process), it may be laminated between two or more glass substrates, and/or the phosphor may be embedded in PVB, PDMS, or other polymer-based or polymer-like materials (e.g., EVA or other hydrophobic polymers that encapsulate and protect against humidity ingress). In any event, the modified glass may then be used as the phosphor plate 314 and attached to the glass backplane containing an LED array that includes the mirrored recesses shown in FIG. 3A. Certain example embodiments need not necessarily include the sealant 306. Instead, the opening 310 may be substantially (or fully) hermetically sealed with a phosphor plate. This technique may operate to protect the LED from outside environment effects without subjecting light from the LED to the potential downsides of passing through the sealant cap. Certain example embodiments may include one or both of sealant 306 and the phosphor plate 314.

In certain example embodiments, the phosphors in the phosphor plate 314 may be based on various white phosphors. For example, Ce:YAG and/or Mn:ZnGeO$_4$ may be used as thick films sputtered or sol-gel coated onto the glass substrate. Certain example embodiments may operate by producing a "white" light by combining a blue LED with a yellow phosphor. Certain example embodiments may operate by mixing blue, red, and green phosphors. In certain example embodiments, different types of phosphor plates may be included in a lighting array. For example, some phosphor plates may create blue light and some may create a red light. Thus, a single (or multiple) array may provide multi-colored light for users.

In certain example embodiments, an LED may produce light in a first spectrum, a phosphor material may have a second spectrum and the light exiting an apparatus may have a third spectrum.

In certain example embodiments, the phosphor may include a garnet based phosphor such as, for example yttrium aluminum garnet (YAG—e.g., $Y_3Al_5O_{12}$). YAG phosphors may offer high brightness with increased thermal stability and reliability. In certain example embodiments, terbium aluminum garnet (TAG—e.g., $Tb_3Al_5O_{12}$) may be used in exemplary phosphors. TAG may have equivalent (or similar) reliability and performance with decreased brightness relative to YAG phosphors.

In certain example embodiments, the phosphor may be a nitride type phosphor (e.g., $M_2Si_5N_8$). Such phosphors may have increased thermal stability and reliability but relatively decreased efficiency. In certain example embodiments, the usage of red nitrides may enable a high color rendering index (CRI) value. Also, green nitrides may offer narrow spectral width (e.g., High NTSC).

In certain example embodiments, a green aluminate (e.g., GAL based phosphor) may be used. These phosphors may offer increased efficiency with broad green emission peak for an increased CRI value.

In certain example embodiments, different phosphor types may be mixed. For example TAG and GAL phosphors may be mixed.

In certain example embodiments, a phosphor may be activated by a europium (Eu—e.g., Eu(II) or $Eu^{2+}$). For example, a phosphor based on $SiO4$ that is activated/doped by europium may be used in the phosphor layer 326.

CRI is the relative measure of the shift in surface color of an object when lit by a particular light source. CRI is a modified average of the measurements of how the color rendition of an illumination system compares to that of a reference radiator when illuminating eight reference colors. The CRI equals 100 if the color coordinates of a set of test colors being illuminated by the illumination system are the same as the coordinates of the same test colors being irradiated by the reference radiator. Daylight has a high CRI (approximately 100), with incandescent bulbs also being relatively close (greater than 95), and fluorescent lighting being less accurate (e.g., 70-80).

Accordingly, certain example embodiments may have a CRI above 85, or more preferably above 90, and even more preferably above 95.

Figure 3B:
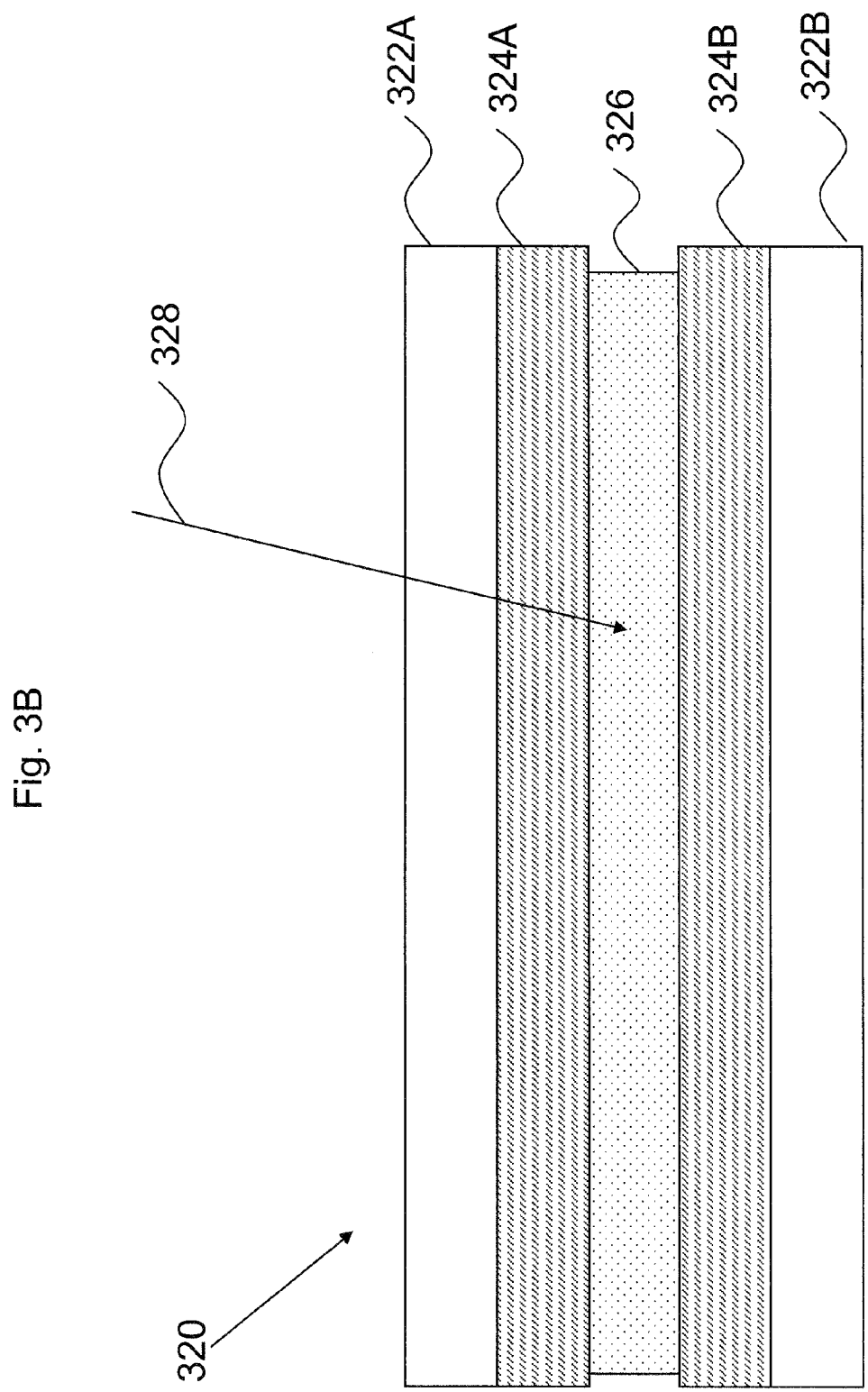
FIG. 3B is an illustrative cross-sectional view showing an exemplary phosphor assembly according to certain example embodiments.

FIG. 3B is an illustrative cross-sectional view showing an exemplary phosphor assembly according to certain example embodiments. In certain example embodiments, a phosphor assembly 320 may be used as the phosphor plate 314 from FIG. 3A. The phosphor assembly 320 may includes opposing glass substrates 322A and 322B. Index layers 324A and 324B may be disposed between substrates 322A and 322B. Further, a phosphor layer 326 may be sandwiched between the index layers 324A and 324B. In certain other example embodiments, however, the phosphors may be embedded in a laminate material such as, for example, PVB, EVA, PMMA, PDMS, etc. This polymer may be provided between the substrates 322A and 322B, or between a single superstrate and the underlying LEDs and the substrate that they are embedded in or otherwise disposed in or on.

In certain example embodiments, the index layers 324A and 324B may be high index layers with an index of at least 1.8, more preferably at least about 1.95-2.0, and even more preferably around 2.2. In certain example embodiments, index layers with a high index may be used with blue LEDs.

In certain example embodiments, the index layers 324A and 324B may be low index layers with an index of between about 1.3456 and 1.5. In certain example embodiments, the lower index layers may be used in conjunction with white light (e.g., white LEDs).

In certain example embodiments, the layered construction of the phosphor assembly may facilitate the capture of light (e.g., light ray 328) such that light "bounces" between index layers 324A and 324B. One result of this light bouncing between the two index layers may be the continued and/or heightened excitation of the phosphor layer, e.g., resulting from the "bouncing" of the light between the index layers sandhiching the phosphor material.

In certain example embodiments, the phosphor layer 326 may include the phosphors described above. The thickness of the layer may be between 50 and 350 microns, more preferably between about 100 and 250 microns, and sometimes about 150 microns in thickness.

Figure 3C:
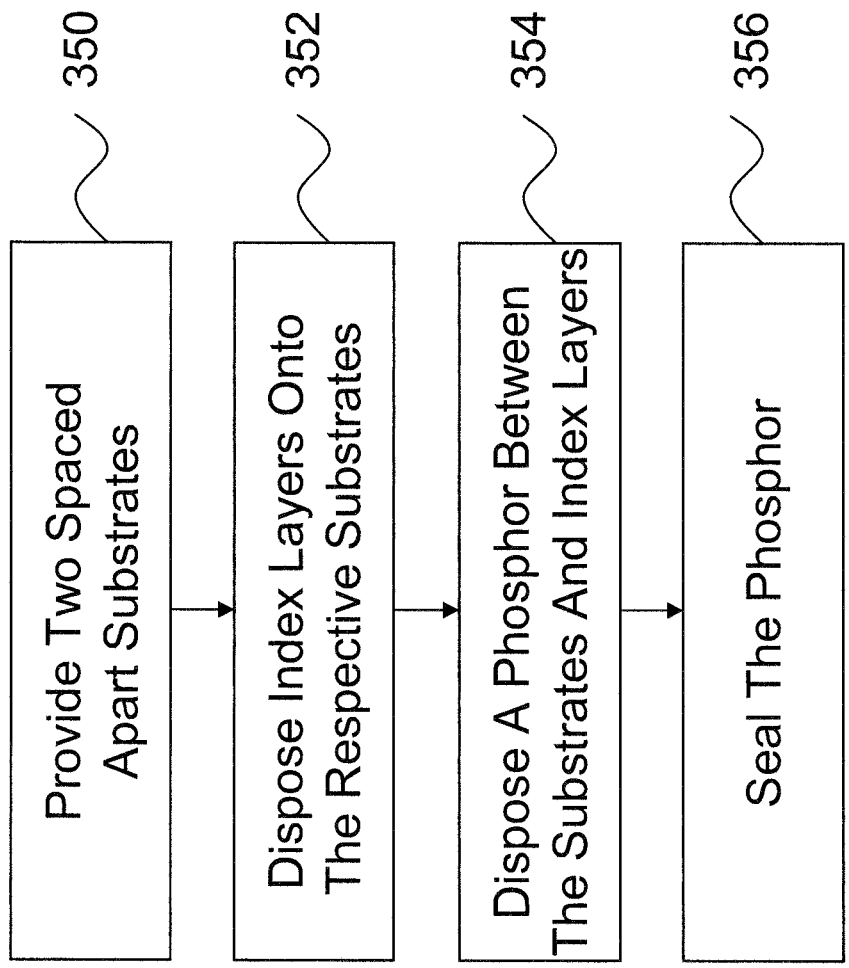
FIG. 3C is a flowchart of an example process for creating an example phosphor assembly according to certain example embodiments.

FIG. 3C is a flowchart of an example process for creating an example phosphor assembly according to certain example embodiments. In step 350 two substrates (e.g., glass substrates) are provided. In step 352, index layers are disposed onto the respective substrates. In certain example embodiments, the index layers may be high index layers (e.g., >1.8). In certain example embodiments, the index layers may be lower index layers (e.g., 1.3-1.5). In step 354 a phosphor layer or component is disposed between the substrates and the index layers. As seen from FIG. 3B, this may form a sandwich of the phosphor component between the index layers and the glass substrates. In step 356, the phosphor component may be sealed. In certain example embodiments this may be a hermetic seal. In certain example embodiments, the seal may be a hydrophobic seal that prevents water from entering and engaging with the phosphor layer. It is noted that a second substrate need not necessarily be used to provide the hermetic seal. For instance, certain example embodiments may include a thin film seal of or including ZrOx, DLC, SiOx, SixNy, SiOxNy, etc., which may be sputter-deposited, disposed via flame pyrolysis, or atomic layer deposition (ALD) deposited. In still other embodiments, an encapsulating polymer or polymer-like material may be used including, for example, PVB, EVA, PMMA, etc. As alluded to above, the phosphors may be embedded in such a material.

It will be appreciated that the steps shown in FIG. 3C may be modified according to certain example embodiments. For example, a first substrate may be provided; a first index layer may be disposed (e.g., deposited, sputtered) onto the substrate; the phosphor layer may be placed; another index layer may be placed; the phosphor may be sealed; and a "top" substrate may be added to the assembly. The components of the assembly may be laminated or otherwise bonded together as indicated above.

Figure 4:
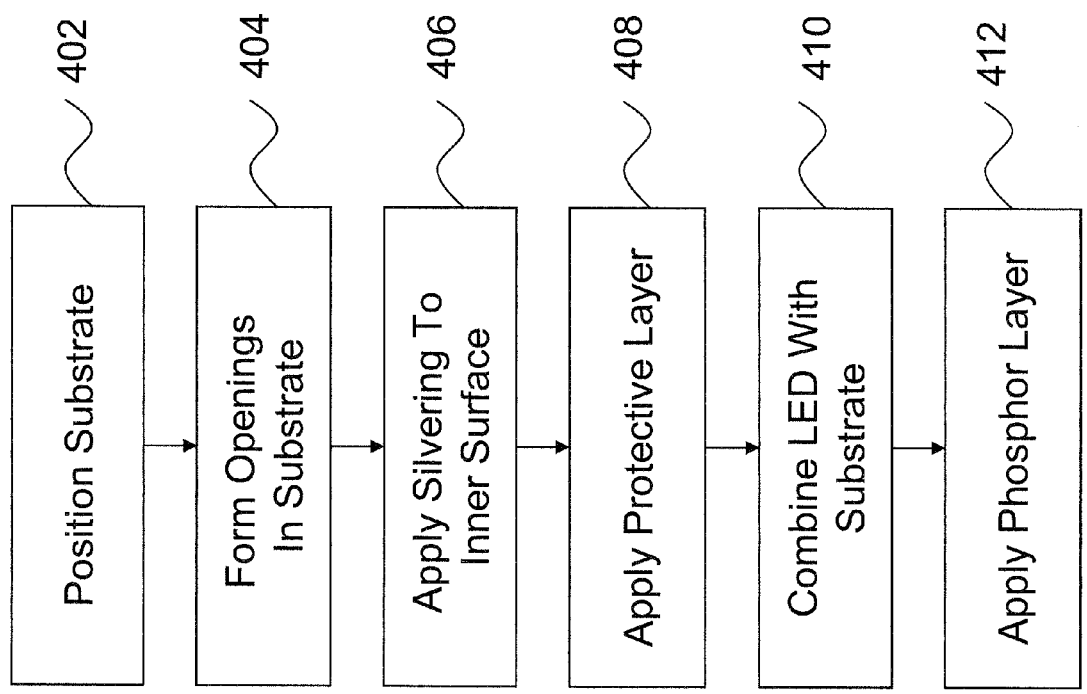
FIG. 4 is a flowchart of an example process for creating a lighting fixture according to certain example embodiments.

FIG. 4 is a flowchart of an example process for creating a lighting fixture according to certain example embodiments. Steps 402, 404, 406, 408, and 410 may be respectively similar to steps 202, 204, 206, 208, and 210 from FIG. 2. Here, in FIG. 4, however, a phosphor layer may be applied to the glass substrate in step 412. As discussed above, the phosphor layer may be embedded in a glass substrate. Thus, a glass substrate with embedded phosphors may be disposed opposite the LED and against the glass substrate with CPCs (compound parabolic concentrators).

Certain example embodiments may include a lens that may operate in conjunction with (or separate from) the formed CPCs (e.g., the mirrored cavities). In certain example embodiments, the lens may be a compound collection lens that is compact and retrofits into the CPC. The lens may facilitate increased efficiency and may allow for increased collimation of the light rays with decreased angular distribution at the exit of the lens (preferably 5-60 degrees, more preferably 5-45 degrees, and still more preferably 10-30 degrees, of distribution). In certain example embodiments, the lens may be constructed out of PMMA (Polymethyl methacrylate), a polymer that can be cast with a high optical surface finish. This polymer may protect and/or prevent yellowing when exposed to UV. Of course, other polymers and other materials may be used in different embodiments. In certain example embodiments, the lens may be formed via casting. In certain example embodiments, the lens may be formed out of glass such as, for example a clear, high transmission glass.

One technique of producing high transmission glass is by producing low iron glass. See, for example, U.S. Pat. Nos. 7,700,870; 7,557,053; and 5,030,594, and U.S. Publication Nos. 2006/0169316; 2006/0249199; 2007/0215205; 2009/0223252; 2010/0122728; 2009/0217978; 2010/0255980, the entire contents of each of which are hereby incorporated herein by reference.

An exemplary soda-lime-silica base glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| Na2O | 10-20% |
| CaO | 5-15% |
| MgO | 0-7% |
| $Al_2O_3$ | 0-5% |
| $K_2O$ | 0-5% |

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass (e.g., see Table 1 above), in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., antimony and/or the like). In certain example embodiments of this invention, the resulting glass has visible transmission of at least 75%, more preferably at least 80%, even more preferably of at least 85%, and most preferably of at least about 90% (sometimes at least 91%) (Lt D65).

In certain embodiments of this invention, in addition to the base glass, the glass and/or glass batch comprises or consists essentially of materials as set forth in Table 2 below (in terms of weight percentage of the total glass composition):

TABLE 2

EXAMPLE ADDITIONAL MATERIALS IN GLASS

| Ingredient | General (Wt. %) | More Preferred | Most Preferred |
|---|---|---|---|
| total iron (expressed as $Fe_2O_3$) | 0.001-0.06% | 0.005-0.045% | 0.01-0.03% |
| % FeO | 0-0.0040% | 0-0.0030% | 0.001-0.0025% |
| glass redox (FeO/total iron) | <=0.10 | <=0.06 | <=0.04 |
| cerium oxide | 0-0.07% | 0-0.04% | 0-0.02% |
| antimony oxide | 0.01-1.0% | 0.01-0.5% | 0.1-0.3% |
| $SO_3$ | 0.1-1.0% | 0.2-0.6% | 0.25-0.5% |
| $TiO_2$ | 0-1.0% | 0.005-0.4% | 0.01-0.04% |

In certain example embodiments, the antimony may be added to the glass batch in the form of one or more of $Sb_2O_3$ and/or $NaSbO_3$. Note also Sb($Sb_2O_5$). The use of the term antimony oxide herein means antimony in any possible oxidation state, and is not intended to be limiting to any particular stoichiometry.

The low glass redox evidences the highly oxidized nature of the glass. Due to the antimony (Sb), the glass is oxidized to a very low ferrous content (% FeO) by combinational oxidation with antimony in the form of antimony trioxide ($Sb_2O_3$), sodium antimonite ($NaSbO_3$), sodium pyroantimonate (Sb ($Sb_2O_5$)), sodium or potassium nitrate and/or sodium sulfate. In certain example embodiments, the composition of the glass substrate 1 includes at least twice as much antimony oxide as total iron oxide, by weight, more preferably at least about three times as much, and most preferably at least about four times as much antimony oxide as total iron oxide.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of or free of one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

In view of the above, glasses according to certain example embodiments of this invention achieve a neutral or substantially clear color and/or high visible transmission. In certain embodiments, resulting glasses according to certain example embodiments of this invention may be characterized by one or more of the following transmissive optical or color characteristics when measured at a thickness of from about 1 mm-6 mm (most preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

GLASS CHARACTERISTICS OF EXAMPLE EMBODIMENTS

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.004% | = 0.003% | <=0.0020% |
| L* (Ill. D65, 10 deg.): | 90-99 | n/a | n/a |
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

Thus, a lens may be created according to certain example embodiments by using a polymer, glass, or other suitable material. FIGS. 5A-5B are illustrative cross-sectional views of example lenses. Various different lens types may be constructed based on the needs of a particular application. Accordingly, in certain example embodiments, a lens may be designed in two stages, e.g., a 2D design step followed by a 3D ray-tracing step. Given the parameters of the particular design, a MATLAB (Matrix Laboratory—a software program available from MathWorks) routine may be used to calculate the tailored profiles L0-L5 in FIG. 5A and L0A-L5F in FIG. 5B. As part of this calculation a refractive index gradient may also be determined.

After the calculations are performed in MATLAB, the resulting lens may be evaluated in ASAP, a commercially available optical design software. These steps are repeated in a MATLAB optimization loop until a (global) maximum for a merit function is reached. In certain example embodiments, the optimization process may use a Nelder-Mead algorithm (e.g., as implemented in MATLAB). In certain example embodiments, the merit function may be related to the flux that gets through the lens at a right angle. The lens may then be optimized for étendue transfer between the die (e.g., LED) and the target (and for example, operate to conserve étendue). The named inventors of the subject matter herein have termed this technique Étendue Optimization Synchronization.

In certain example embodiments, the profiles L3 and L4 (or corresponding profiles in FIG. 5B) may be joined at an angle of between 10 and 50 degrees, more preferably between 30 and 40 degrees, and sometimes about 35 degrees. In certain example embodiments the angle may be formed based off of a linear extension of the profiles (e.g., planes that extend along the general direction of the respective profiles). In certain example embodiments, the joining of the profiles may be at a sharp point or may be with a smooth curvature. Accordingly, certain example embodiments may use tailored profiles to more accurately transform the light of the source for increased étendue efficiency (e.g., to better conserve étendue). Thus, light from LED 502 or 522 may pass through the protective seal 504/524 and out and through the lens 500/520. Further, as described in greater detail below, the light may then be reflected by a CPC in a glass substrate.

Certain example embodiments may also include other considerations when constructing a lens. For example, the total internal reflection (TIR) at the reflecting surface or the presence or absence of an anti-reflective coating can influence the usability of the lens. Accordingly, in certain example embodiments, the above may be taken into consideration in the ray-tracing step described above. For example, in the ASAP code, values for the coatings on the refractive surfaces (e.g. a bare coating that satisfies Fresnel's law) may be included. Thus, certain example embodiments may account for such features as part of the discussed global merit function for a given lens.

Figure 5C:
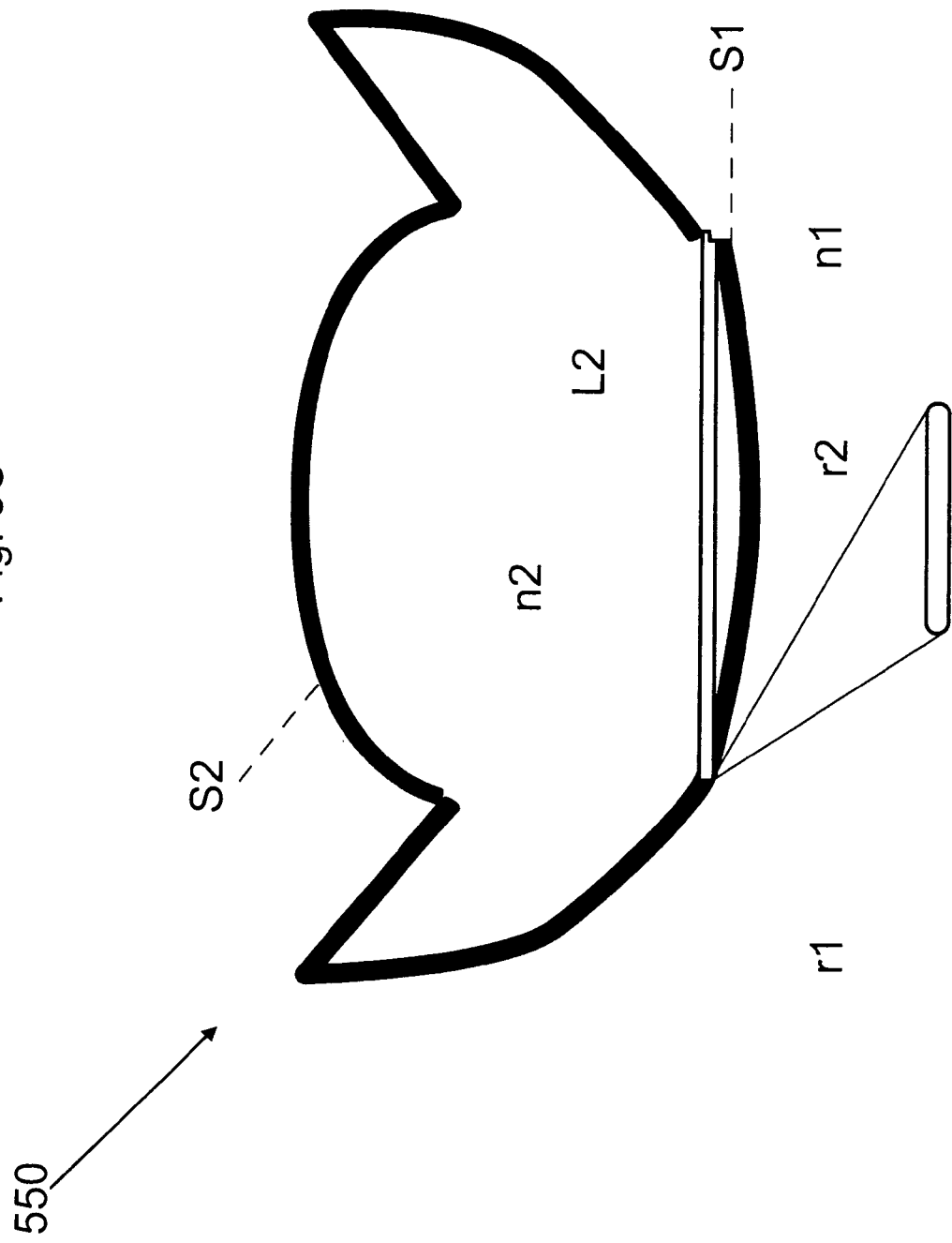
FIG. 5C is an illustrative cross-sectional view of an example lens according to certain example embodiments.

FIG. 5C is an illustrative cross-sectional view of another example lens according to certain example embodiments. Here, a lens 550 may include or be associated with various properties. Specifically, in this embodiment, n1 may be the refractive index of an LED encapsulate (e.g., element 106 in FIG. 1B). In certain example embodiments, the LED used in conjunction with a lens may be a bare die LED (e.g., no encapsulate may be used) where the refractive index is unity. Also, n2 may be the refractive index of the collection lens; L2 may be the diameter of the central part of the lens; S1 may be the lower surface where light from an LED enters the lens; S2 may be the upper surface where light exits the lens; and r1 and r2 may respectively be the extremities of the LED below the lens.

Accordingly, in certain example embodiments the étendue at the surface S1 may be determined such that $E1=2*(n1)*(r2-r1)$. Further, the étendue of the light leaving S2 may be $E2=4*n2*L2*\sin\theta$. Here, $\theta$ may be the desired angle that collects and collimates the light. Furthermore, by the conservation of étendue, E1 and E2 may be determined to be equal. From this principle, the profile of S1 may be calculated. Additionally, using the principle of conservation of étendue an angle of the side lobes or flanges may be calculated.

It will be appreciated that the above calculations are provided with respect to the shown 2D cross-section of the lens. Accordingly, in certain example embodiments, where a 3D lens is applied to CPC, different equations may be applied. In certain example embodiments, an array of LEDs may be used and lens derived based on the array. The lenses shown in FIGS. 5A-5C, for instance, may be taken through a center cross-section of an example lens. A three-dimensional lens may simply rotate, with the "edge" of the lens adjacent the substrate being fixed in position.

Figure 5D:
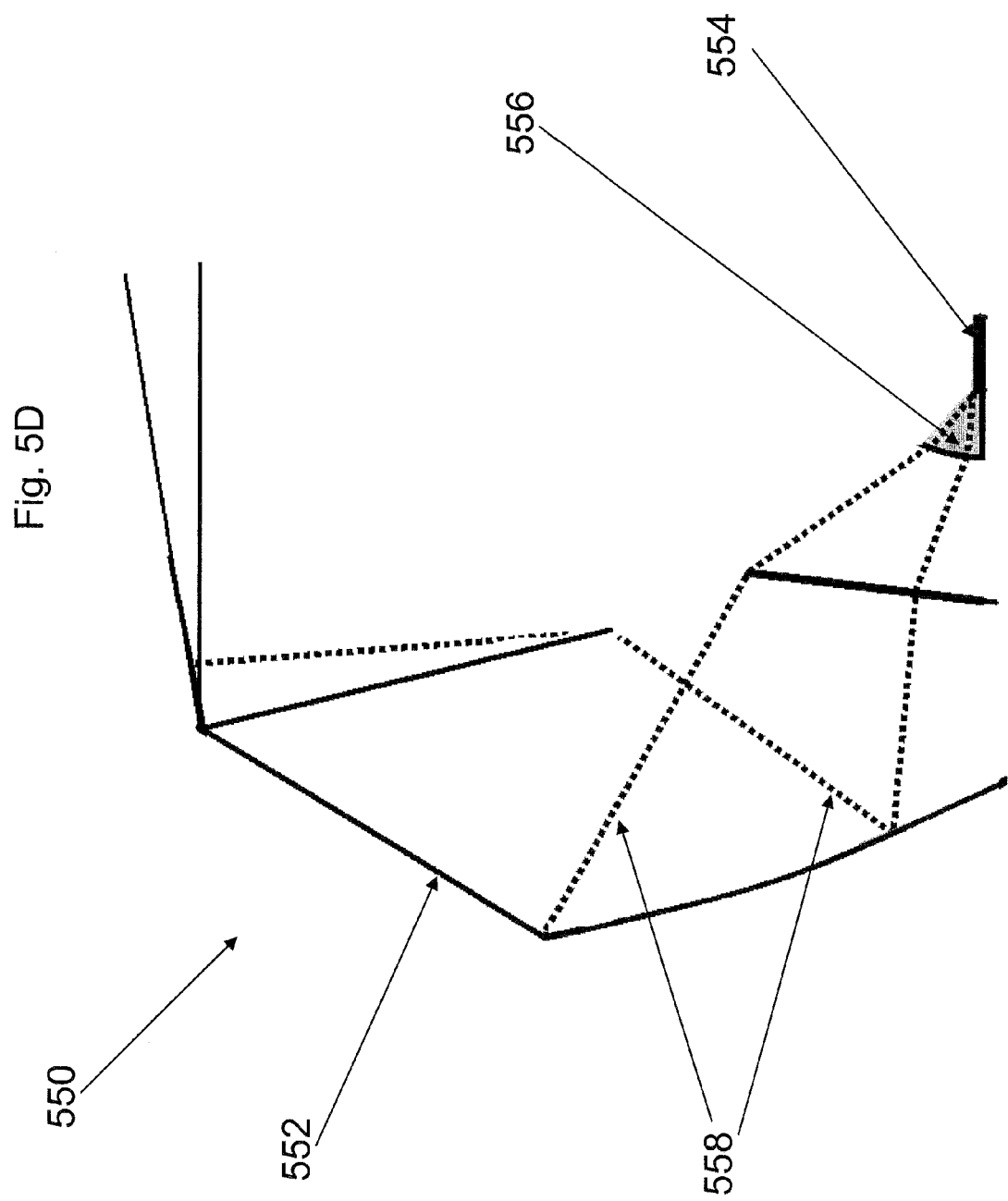
FIG. 5D is an illustrative cross-sectional view of a portion of an example lens according to certain example embodiments.

FIG. 5D is an illustrative cross-sectional view of a portion of an example lens according to certain example embodiments. Here, LED 554 is encapsulated by a sealant 556. The LED 554 may emit light that upon exiting the sealant 556 may be refracted (e.g., shown by the light rays 558 changing direction). The light rays 558 may interact with a lens 550 that includes a flange or flared portion 552. The interaction of the light with the lens 550 may function to increase the collection efficiency of a lighting luminaire. In certain example embodiments, the passage of the light through the lens may conserve the étendue of the emitted light.

In certain example embodiments, a lens may be used with a newly created CPC reflector or may be used to retrofit an existing and/or in use CPC reflector. Such a combination (e.g., using a lens with a cavity or CPC reflector) may operate to further increase the collection efficiency of an example lighting luminaire.

In certain example embodiments the exit angle of light from the lens 110 may be 1-60 degrees, more preferably 5-45 degrees, and still more preferably between 10 and 30 degrees. Thus, in certain example embodiments, the light exiting the lens may be at least substantially collimated.

In certain example embodiments the lens may include different portions. For example a body portion of the lens may have a curved upper surface. First and second flares may be included on opposing sides of the body portion, the first and second flares being symmetrical about an axis of the body portion. Each of the flares may include first, second, and third profiles. The first profile may be parabolic in shape and curving away from the body portion. The second profile may be extending generally upwardly and inwardly from an uppermost part of the first profile. The third profile may be extending between an uppermost part of the second profile and an end of the curved upper surface of the body portion. The lens may be structured such that an angle (e.g., as described above between L3 and L4) is formed with respect to planes extending from the second and third profiles.

In certain example embodiments, the planes may extend from the second and third profiles to meet at a height that is above a maximum height of the curved upper surface of the body portion. In certain example embodiments, wherein a meeting location between the third profile and the end of the curved upper surface of the body portion is below a meeting location between the first and second profiles. In certain example embodiments, at least part of the curved upper surface of the body portion is substantially flat.

In certain example embodiments, the lens (e.g., a substantially axially symmetrical lens) is disposed or affixed to the LED (or an array of LEDs) using an example index matching cement (that may be resistant to UV, blue light, or other light spectrums) through the perforated glass (e.g., the glass substrate with cavities). In certain example embodiments, the lens and a silvered mirror surface may act similar to a compound collection lens. Such combinations may achieve a collection efficiency of at least 65%, more preferably at least 75%, even more preferably at least 85%, and in certain embodiments around 87% to 90% (e.g., 89%). These efficiencies may take into account an ideal reflective coating and/or may neglect Fresnel losses.

Figure 6A:
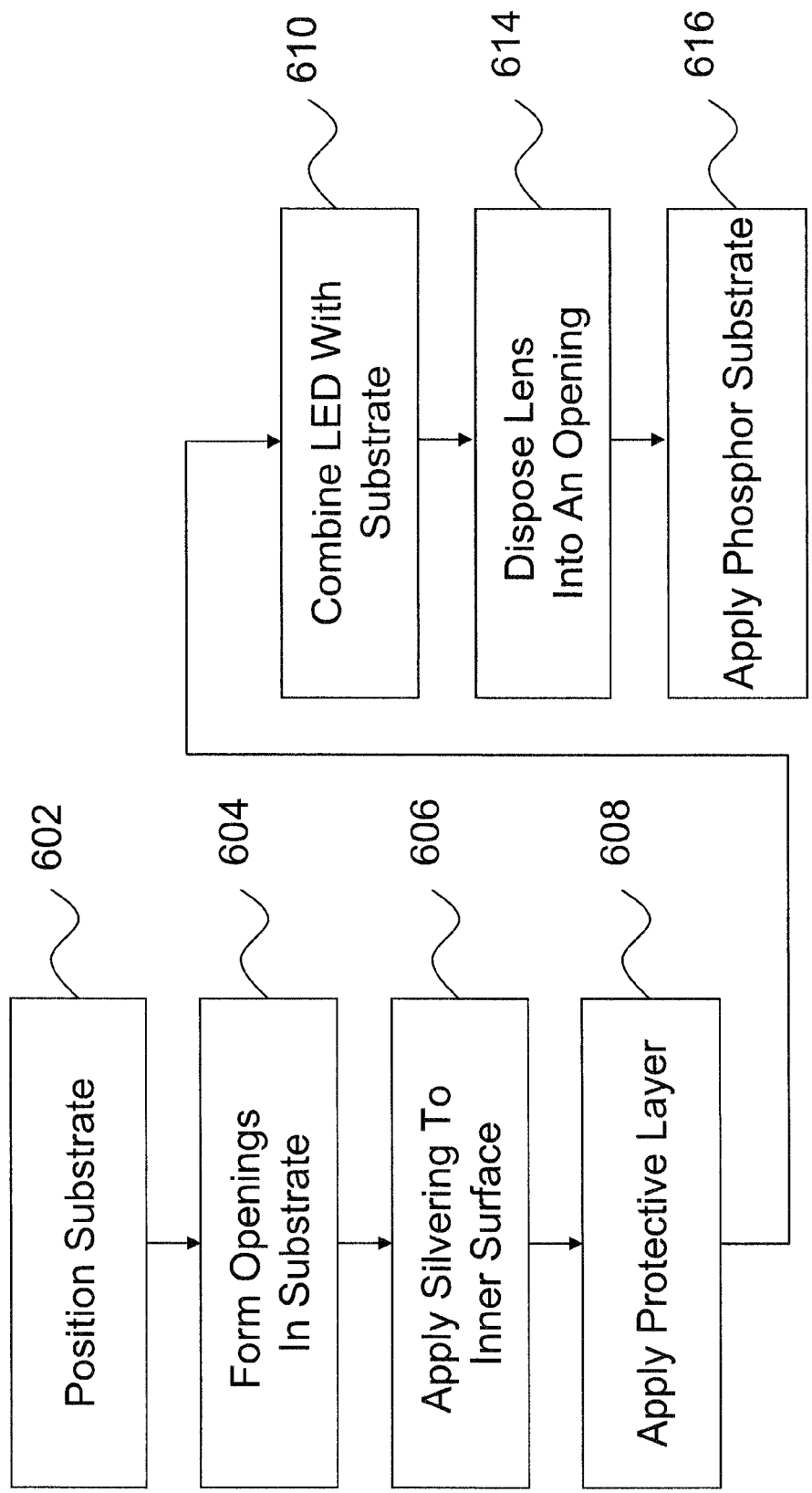
FIG. 6A shows a flowchart of an example process for creating a light fixture including an exemplary lens according to certain example embodiments.

FIG. 6A shows a flowchart of an example process for creating a light fixture including an exemplary lens according to certain example embodiments. Steps 602, 604, 606, 608, 610, and 616 may correspond to steps 402, 404, 406, 408, 410, and 412 respectively of FIG. 4. Thus, after combining the LED (e.g., with a PCB) to the formed substrate, a lens may be created as described above. In certain example embodiments, the lens may be created separately (e.g., before the process described herein) and may then be disposed in a cavity. In certain example embodiments, the lens may be formed to fit comfortably against the formed cavity. For example, profile L2 show in FIG. 5A may substantially match the curvature of the surface of opening (e.g., 108 from FIG. 1A). The disposed lens may be adhered to the sidewalls of the opening via a clear adhesive or the like (e.g., PVB). Once the lens is mounted in the opening of the substrate, a phosphor substrate may be disposed on the substrate (e.g., opposite the disposed LEDs).

Figure 6B:
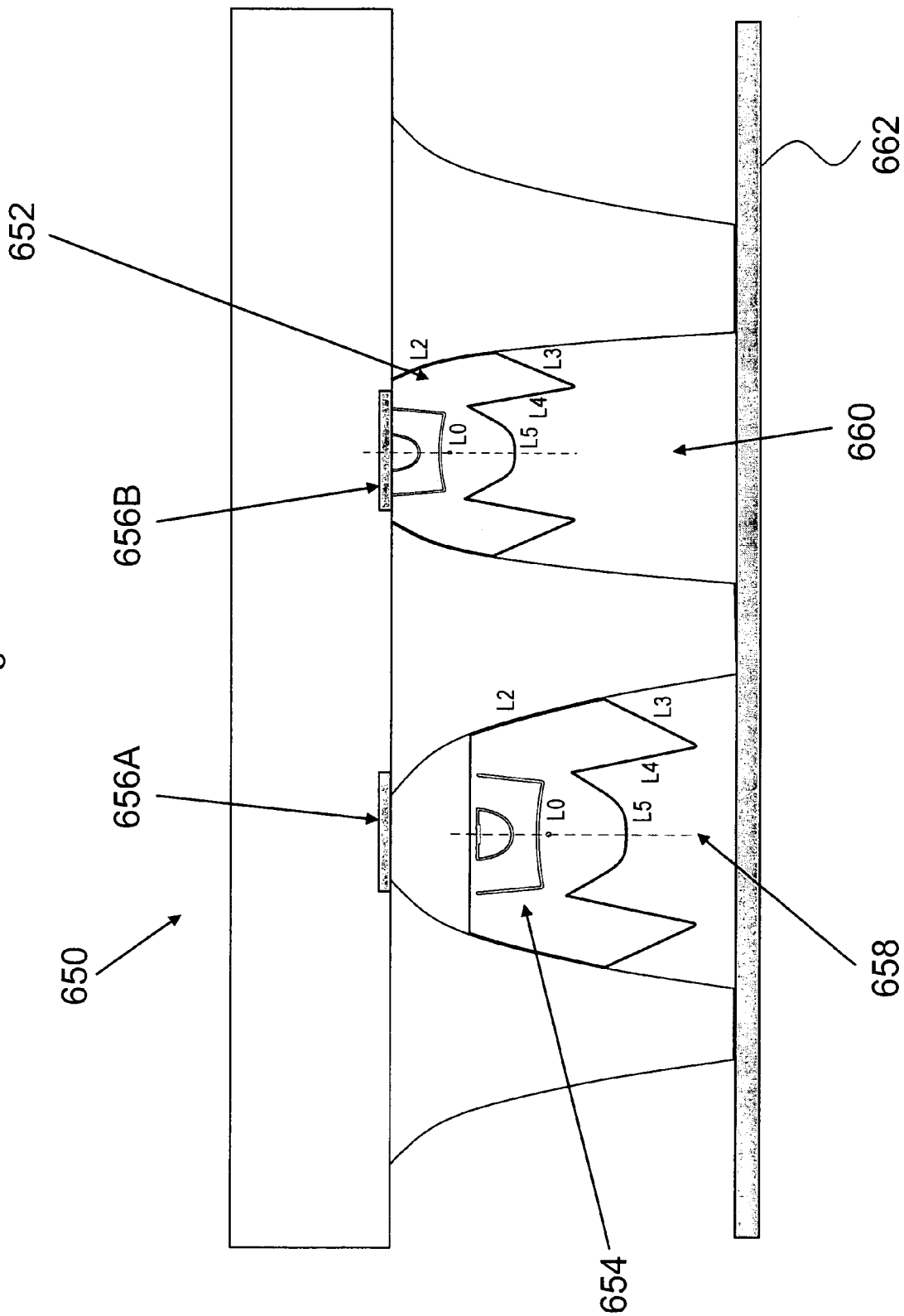
FIG. 6B is an illustrative cross-sectional view showing another exemplary lighting fixture according to certain example embodiments.

FIG. 6B is an illustrative cross-sectional view showing another exemplary lighting fixture according to certain example embodiments. The structure of lighting fixture 650 may be similar to that shown in FIG. 3A. Thus, lighting fixture 650 may include one or more cavities 658 and 660 in which LEDs 656A and 656B are disposed. The cavities may be toped by a phosphor layer 662. Further, the cavities may have lenses disposed in them. Thus, lens 654 may be disposed in cavity 658 and lens 652 may be disposed 660. As shown, the location of the lens with a cavity of the lighting fixture may vary depending on the needs of a given application. Accordingly, lens 652 may be disposed further into the cavity 660 than the lens 654 is disposed into the cavity 658. The location of a lens may vary, for example, depending on the nature of the LED that is disposed with the respective cavity.

Figure 10:
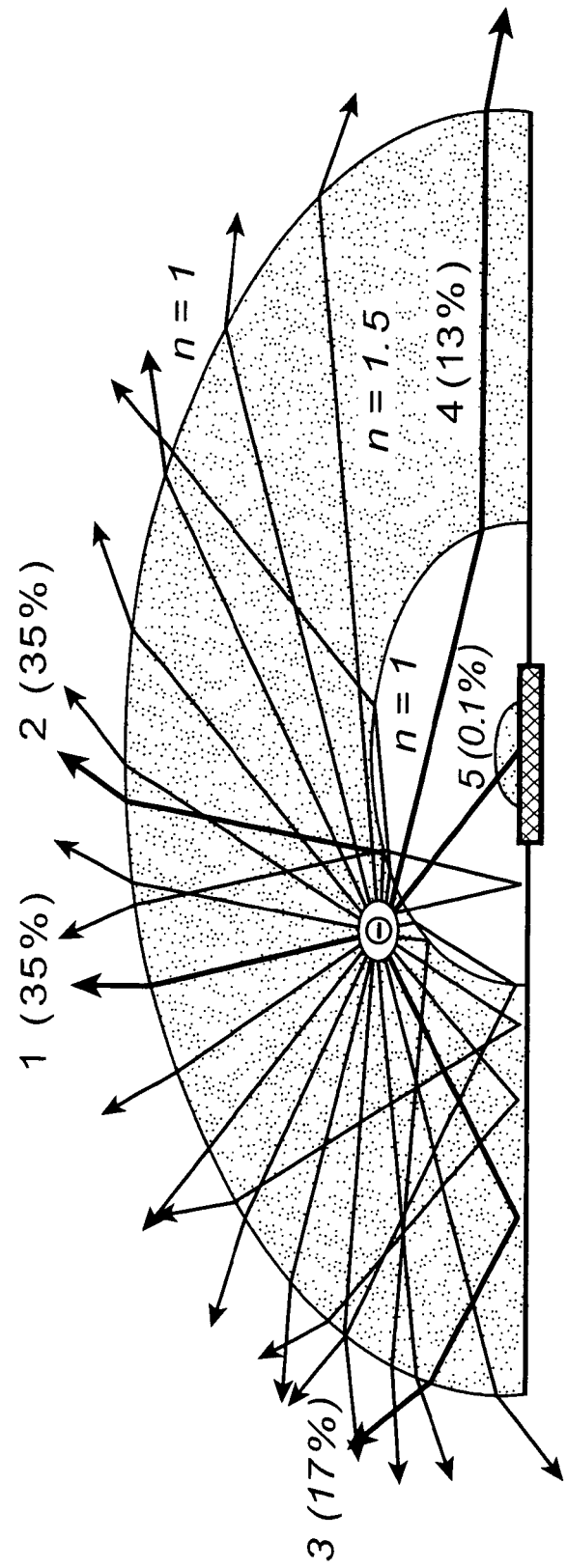
FIG. 10 is a cross-sectional view of an exemplary curved phosphor plate.

FIG. 10 is a cross-sectional view of an exemplary curved phosphor plate. Here, the optical system of the curved plate and the phosphor coating also possesses a lensing effect with two collecting parts. In certain example embodiments, a phosphor plate disposed on a glass substrate with openings (e.g., 314 in FIG. 3) may be curved. In certain example embodiments, a curved phosphor plate may be used instead of the formed openings and/or instead of the compound lens described herein.

In certain example embodiments, after the collecting device, a fly's eye integrator may be disposed. Alternatively, or in addition, a relay lens system may be used to project a uniform beam onto a given target. Thus, a compact illumination engine may be designed and implemented.

In certain example embodiments, a Fresnel lens may be used to provide additional lighting control. For example a Fresnel lens or the like may be placed at a position prior to light from an LED hitting the phosphor layer. In certain example embodiments, the Fresnel lens may be operated to further diffuse and homogenize the light being emitted from a light source.

Figure 12:
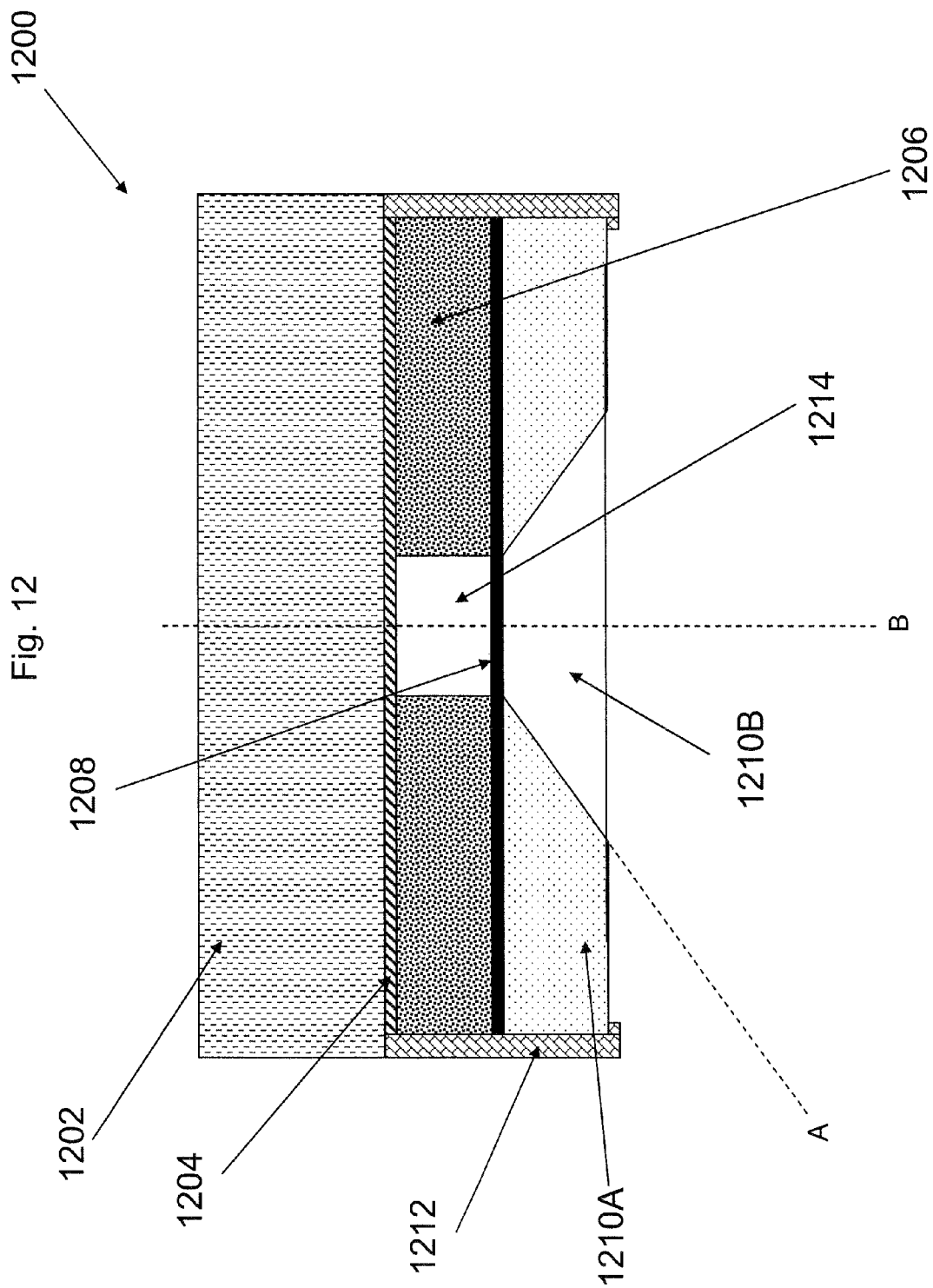
FIG. 12 is a cross-sectional view of another example light fixture according to certain example embodiments.

FIG. 12 is a cross-sectional view of another example light fixture according to certain example embodiments. Light fixture 1200 may include a heat sink 1202. The heat sink 1202 may, for example, be a copper heat sink. However, other types of heat sinks may be used in different embodiments of this invention. The heat sink 1202 may be disposed with an LED layer 1204 that may include a PCB board and associated LED or LED array, for example, as is shown in FIG. 1B. In certain example embodiments, an active heat management system may be provided in addition or in the alternative. For example, a thermoelectric cooler (TEC) may be used to facilitate heat transfer from the LED layer 1204 to the heat sink 1202. A glass layer 1206 may include a cavity 1214. The glass layer 1206 may function to collimate light that is emitted from the LED layer out through the cavity 1214. A phosphor layer 1208 may be disposed proximate to the glass layer 1206. As noted herein, the phosphor layer may include multiple glass substrates with a phosphor material disposed therebetween. An optic glass layer 1210A and 1210B may be disposed. In certain example embodiments, the optic glass layer may be a Fresnel lens. In certain example embodiments the Fresnel lens may have an angle between line A and line B of between 30 and 70 degrees, more preferably between 40 and 60, and even more preferably about 50 degrees. The lighting fixture 1200 may also include a housing 1212 to hold one or more components.

Figure 11A:
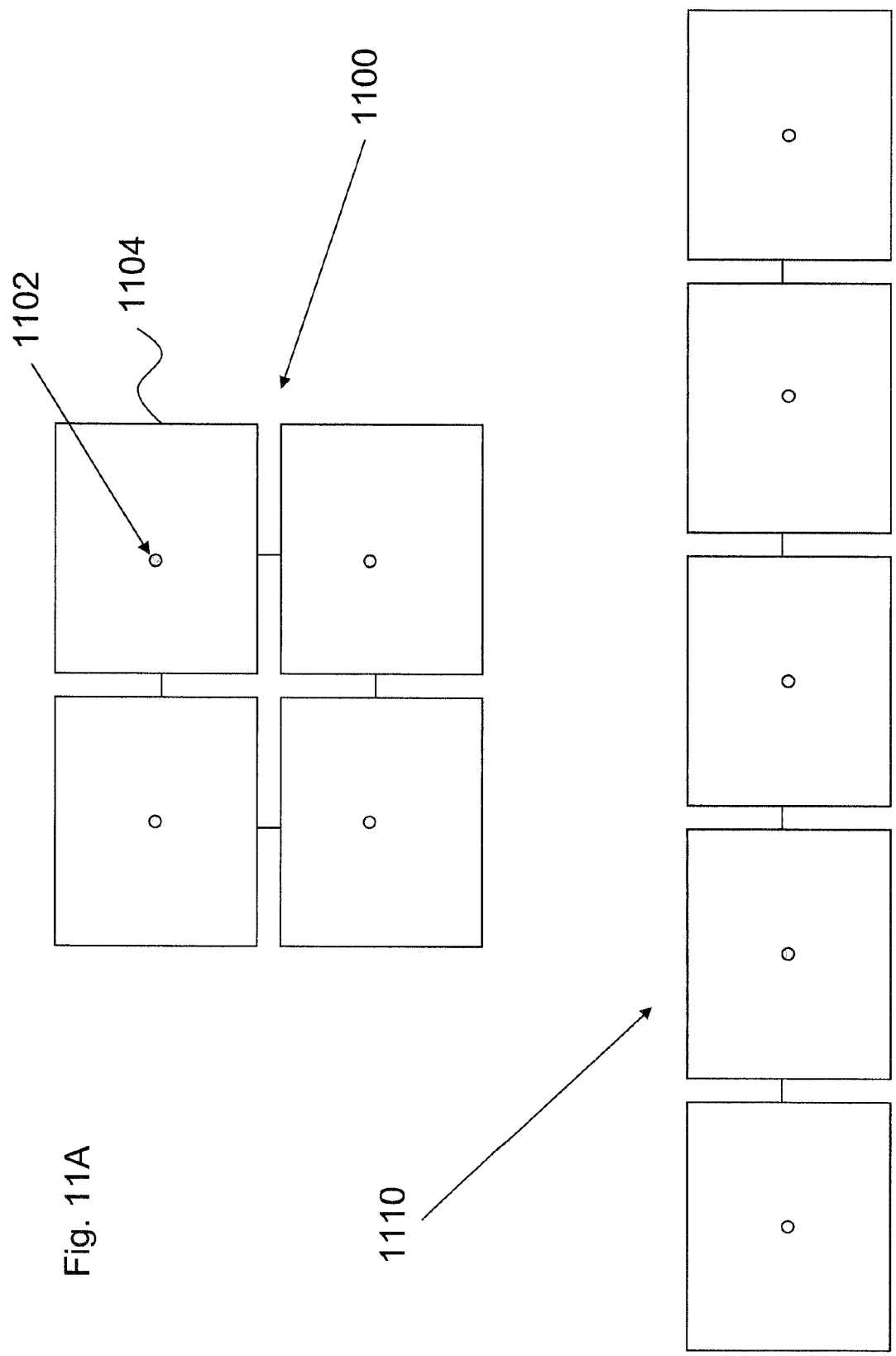
Figure 11B:
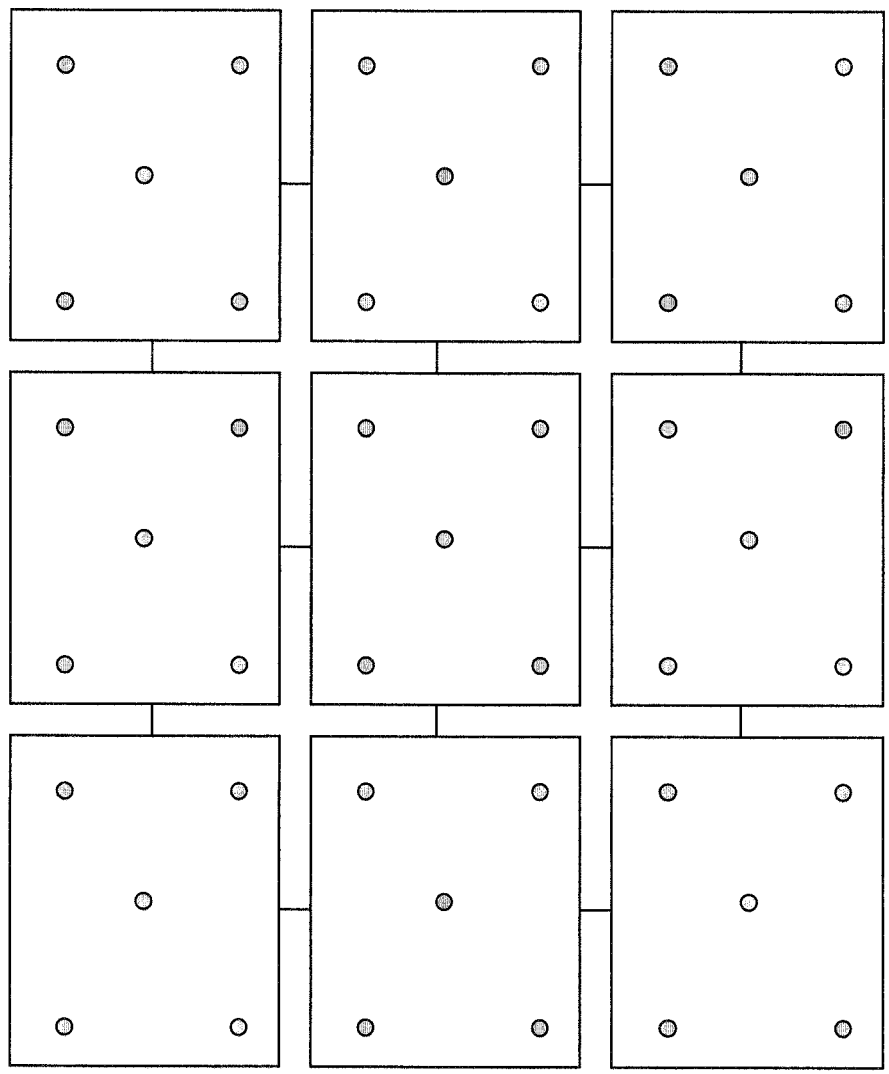

FIG. 11A-11C are diagrams of example lighting luminaires according to certain example embodiments. A light fixture may include multiple separate glass substrates 1104 that include one or more openings 1102 that are backed by LEDs. The separate glass substrates may then be combined to create larger arrangements such as cube fixture 1100 or linear fixture 1110. Furthermore, the individual glass substrates may also include multiple formed openings, each containing one or more LEDs as shown with arrangement 1120. The glass substrates may also be formed in new and interesting designs. For example, arrangement 1130 with hexagonally formed glass substrates may be constructed.

Accordingly, the formed glass substrates may include various shapes (e.g., circles, etc). In certain example embodiments, the formed openings in the glass substrates may be arranged in a cubic, hexagonal, circular, triangular, or other shaped form. In certain example embodiments, the formed openings may have varying diameters and may be associated with LEDs that have a different power output (e.g., either through design of the LED or a restriction on the power supplied to a given LED).

In certain example embodiments, a lens may allow a portion (e.g., most) of the light emitted by an LED or LED array to be extracted out while the CPC may allow for the collimation and control of the spread of the emitted light. In certain example embodiments, the combination of the lens and the CPC are used in tandem to conserve the étendue of the emitted light. In certain example embodiments, a degree of collection of light (e.g., the efficiency) may be at least 65%, more preferably at least 75%, even more preferably at least 85%, and in certain embodiments around 87% to 90%.

Figure 13:
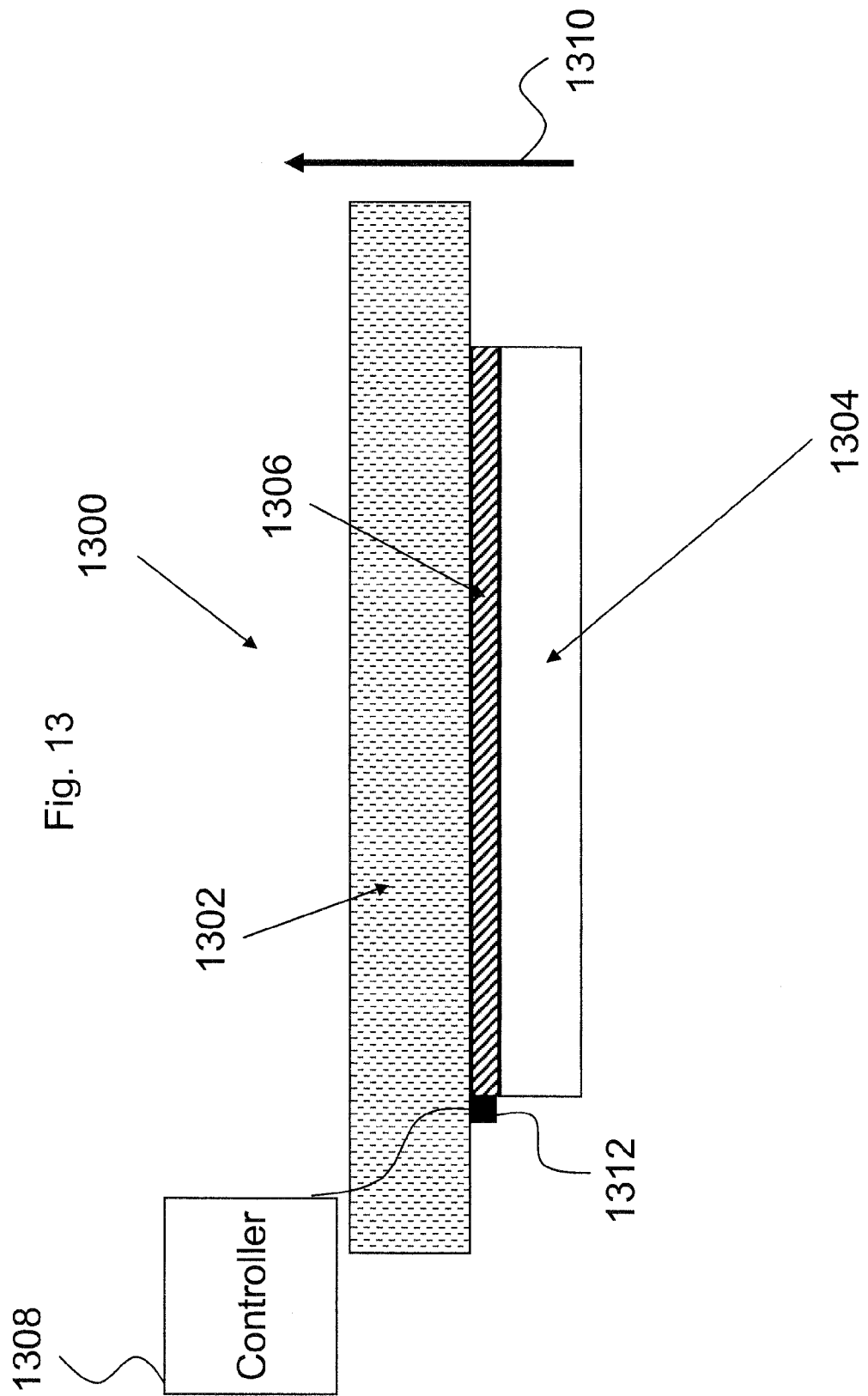
FIG. 13 is a cross-section view of an exemplary active heat management system according to certain example embodiments.

FIG. 13 is a cross-section view of an exemplary active heat management system according to certain example embodiments. LED light sources produce heat. In certain example embodiments, managing the heat of the LED may increase the efficiency of a lighting luminaire. Accordingly, certain example embodiments may include an active heat management system. A portion of an example lighting luminaire 1300 may include a passive heat sink 1302 (e.g., of copper of another similarly disposed material). The heat sink 1302 may be affixed to a LED layer 1304 by an active heat managing system 1306. In certain example embodiments, this system 1306 may be a thermoelectric cooler (TEC). Such systems may rely upon the Peltier effect to move heat between one side of the cooler to the other. Accordingly, heat may be transferred (e.g., as shown with arrow 1310) via the system 1306 from the LED 1304 to the heat sink 1302. The system 1306 may be powered by an electrical current supplied through a controller 1308 that provides power to the system 1306. The controller 1308 may also communicate with a sensor 1312 to determine temperature characteristics of the heat sink 1302 and the LED 1304. In certain example embodiments, the controller 1308 may include one or processors or control circuits that manage power and/or provide control over the operation of the system 1306. In other words, in certain example embodiments, the controller 1308 may be provided with means for monitoring the temperature of the lighting system and/or portions thereof and selectively activate cooling elements to transfer heat away from the LEDs, e.g., using the Peltier effect and one or more Peltier elements. The Peltier effect may be achieved using bismuth-based Peltier elements and/or the like. For example, in certain instances, bismuth telluride (e.g., Bi2Te3) may be used. In certain example embodiments, other types of materials with high S coefficients may be used.

In certain example embodiments, the controller may supply power to the LED(s). In certain example embodiments, an LED tile may include an array or group of LEDs, each having their own drive electronics that facilitate the provision of active cooling to the LEDs. In certain example embodiments, the aesthetic characteristics of the tiles may be such that a ratio between the thickness of the tile and the length of the tile (e.g., t/L) is between 0.1 and 0.3, or more preferably between about 0.15 and 0.25, or even more preferably about 0.2. In certain example embodiments, the thickness of a tile may be between bout 3 mm and 15 mm, or more preferably between about 4 mm and 10 mm, and even more preferably about 5 mm. In certain example embodiments, the size characteristics of a tile may facilitate the placement of the tile over existing surfaces.

In certain example embodiments, the tiles may be selectively connectable between each such that power and/or thermal control management is spread over a larger area.

In certain example embodiments, the controller 1308 may have two or more modes. In a first mode a positive voltage may be applied. In a second mode, the controller 1308 may apply a negative voltage to, for example, a TEC. In certain example embodiments, the controller may include an H-bridge circuit.

While linear supplies of power may offer reduced noise, they may have relatively poor efficiency and require larger components with added thermal insulation to reduce the amount of waste heat loading a cooler. In certain example embodiments, two synchronous buck circuits with complementary drivers may provide an increased supply efficiency that may deliver bipolar power from a single positive supply. In certain example embodiments, pulse-width-modulation (PWM) (e.g., that is forced) may control two output voltages such that current is sourced and/or sinked. Accordingly, when the current is sinking, power is recovered and sent back to the supply line.

In certain example embodiments, the Peltier elements are placed on a PCB that piggy-backs the LED containing PCB. The Peltier elements may be thermally connected via a graphene-based ink for maximum heat conduction. This may function to reduce the thermal resistance junction.

Based on information determined by the sensor 1312 the controller 1308 may control how the system 1306 transfers heat between the LED and the heat sink. For example, if the LED 1304 is running "hot" (e.g., has a high temperature) the controller may supply more power to the system 1306, which in turn may cause more heat to be transferred between the LED 1304 and the heat sink 1302.

In certain example embodiments, the controller may operate and attempt to keep the temperature of the LED under 125 degrees Fahrenheit, more preferably under 110 degrees Fahrenheit, and even more preferably under about 100 degrees Fahrenheit. In certain example embodiments, the controller 1308 may control the active cooling elements such that the average luminous efficacy of each tile is within a predetermined range.

In certain example embodiments, the active temperature management described herein may be implemented over an array of LEDs. In certain example embodiments, the TEC layer of a heat management implementation may be sized to fit the given LED (or LED layer) to which it is disposed.

Figure 14:
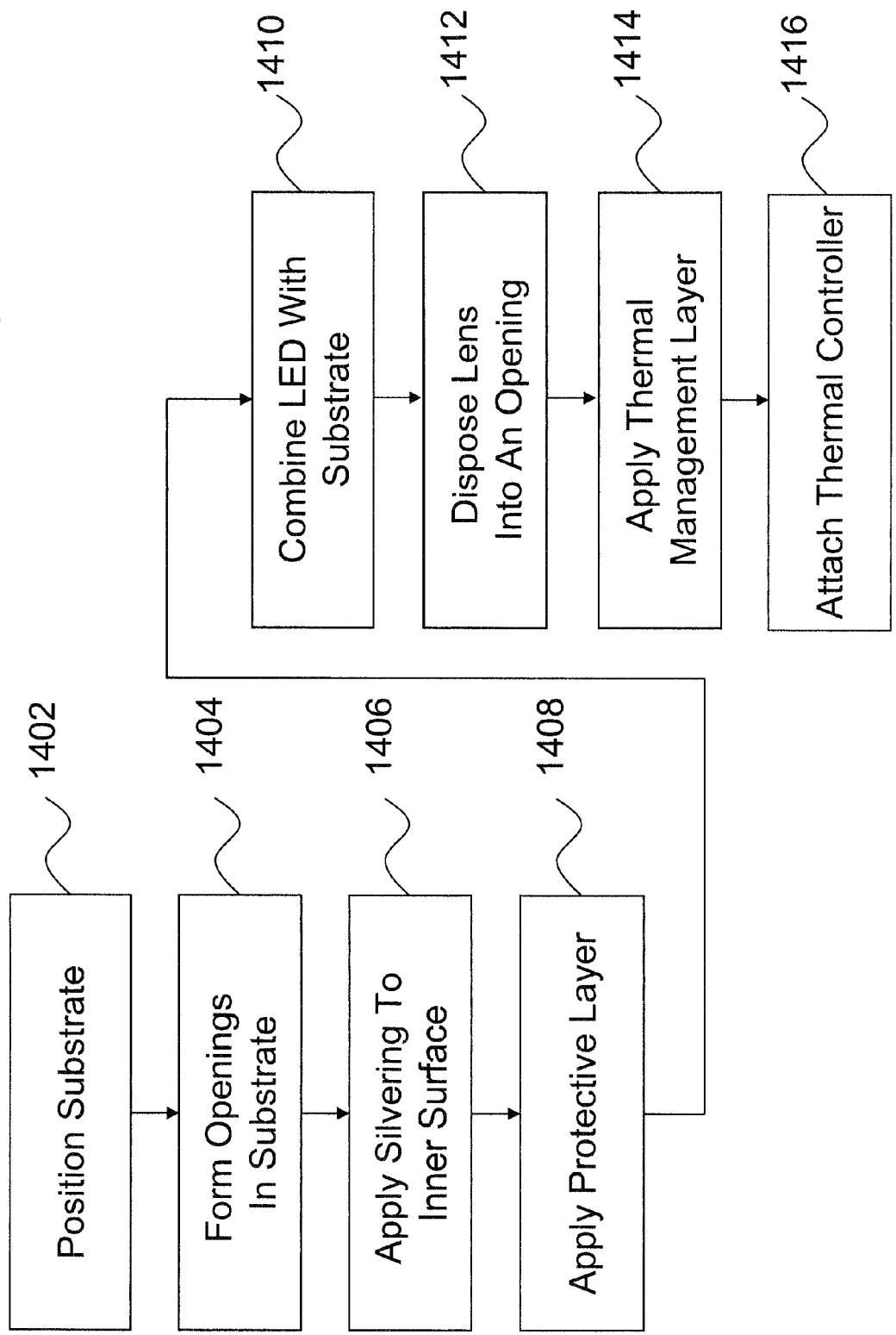
FIG. 14 shows a flowchart of an example process for creating a light fixture including a thermal management layer according to certain example embodiments.

FIG. 14 shows a flowchart of an example process for creating a light fixture including a thermal management layer according to certain example embodiments. Steps 1402, 1404, 1406, 1408, 1410, and 1412 may correspond to steps 402, 404, 406, 408, 410, and 412 respectively of FIG. 4. In certain example embodiments, the cavities or openings and mirror and applying the protective layer, a thermal management layer may be disposed in proximate to the LED in step 1414. In certain example embodiments, the thermal layer may include thin film TECs or the like. In certain example embodiments, the thermal layer and LED may be combined beforehand and then disposed as one into the light fixture. In step 1416 a thermal controller may be attached to one or more thermal layers. The thermal controller may function as a power supply for the LED and/or thermal layer, a sensor, and/or a processor to determine how much electrical energy may be applied to the thermal layer.

In certain example embodiments, a collection of LED tiles and or the LEDs within the tiles may be electrically connected in series, in parallel, or a mixture of the two.

While active cooling may be a preferred embodiment, other types of cooling systems may be implemented according to certain example embodiments. For example, a passive cooling system may be implemented in place of or in addition to an active heating arrangement. Further, while active cooling may be accomplished with Peltier elements, in certain example embodiments an electro-hydrodynamic cooling system may be used. In preferred embodiments, an exemplary cooling system may have little or no moving parts, be relatively compact, and/or facilitate localized heat withdrawal.

As explained herein, multiple LEDs may be used for one cavity. Accordingly, in certain example embodiments, one lens may be used in conjunction with multiple LEDs.

In certain example embodiments, the glass articles described herein (e.g., the glass substrate with openings, the lens, the phosphor layer, etc) may be chemically or thermally strengthened based on design or other considerations (e.g., regulations).

It will be appreciated that the term "TEC" may be used to refer to any thermoelectric cooler or heat pump.

While certain example embodiments herein may have been described in association with a standard home lighting luminaire, it will be appreciated that the techniques described herein may be applied to other types of luminaires. For example, the systems and/or techniques herein may be used for industrial applications, outdoors (e.g., in a garden), on vehicles such as trucks, planes, in electronic devices (e.g., as backlights for LCDs, plasmas, and/or other flat panel displays), etc. Indeed, the techniques herein may be applied to light sources that are used in almost any type of field (if not all).

The example embodiments described herein may be used in connection with the techniques disclosed in any one or more of U.S. application Ser. Nos. 12/923,833; 12/923,834; 12/923,835; 12/923,842; and 12/926,713, the entire contents of each of which are hereby incorporated herein by reference. For example, the insulating glass (IG) unit structures, electrical connections, layer stacks, and/or materials may be used in connection with different embodiments of this invention.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers there between.

While the invention has been described in connection with what is presently considered to be the most practical and preferred embodiment(s), it is to be understood that the invention is not to be limited to the disclosed embodiment, but on the contrary, is intended to cover various modifications and equivalent arrangements included within the spirit and scope of the claims.

What is claimed is:

1. A method of making a light fixture, the method comprising:
   forming a plurality of cavities in a glass substrate, the cavities each being tapered along a depth thereof so that each cavity increases in diameter or distance from a first end thereof to a second end thereof;
   disposing a reflective element on a surface of each of the cavities;
   disposing a lens entirely within each of the cavities; and
   locating a light emitting diode (LED) at or proximate to the first end of each said cavity, so that a plurality of LEDs are provided in a plurality of respective cavities in the glass substrate, so as to enable the associated reflective element to reflect at least some light emitted from the respective LED in a given cavity, substantially conserving &endue of the light from the respective LED, and wherein light from the LED in a given cavity passes through the lens before being output from the light fixture, wherein
   said lens comprises, when viewed in cross section, a main body portion and flare portions extending away from the main body portion and away from the LED in the cavity in which the lens is provided, the main body portion having a curved upper surface, each of the flares including a first profile, a second profile and a third profile, the first profile being parabolic in shape and curving away from the main body portion, the second profile extending upwardly and inwardly from an uppermost part of the first profile, and the third profile extending between an uppermost part of the second profile and an end of the curved upper surface of the main body portion.

2. The method of claim 1, wherein
   each said cavity has a parabolic side wall when viewed in cross section.

3. The method of claim 1, wherein
   the disposing of the reflective element comprises disposing a thin-film material on the surface of each said cavity.

4. The method of claim 3, wherein
   the thin-film material is silver.

5. The method of claim 3, further comprising disposing a protective material over the thin-film material.

6. The method of claim 5, wherein
   the protective material is a polymer, epoxy, resin, or atomic layer deposition (ALD) deposited layer.

7. The method of claim 1, wherein
   each said cavity is a through-hole.

8. The method of claim 1, wherein
   each said cavity is formed to a depth shallower than a depth of the glass substrate.

9. The method of claim 1, wherein
   each said LED is located on a printed circuit board.

10. The method of claim 1, wherein
    each said LED is a chip-on-glass formed LED.

11. The method of claim 1, wherein
    the reflected light exiting the second end of each said cavity is substantially collimated so as to allow for 10-30 degrees of distribution.

12. A lighting apparatus, comprising:
    a glass substrate having a plurality of cavities formed therein, each said cavity (a) being tapered along a depth thereof so that the at least one cavity increases in diameter or width from a first end thereof to a second end thereof, (b) having a reflective element on a surface thereof, and (c) having a lens disposed entirely within the cavity proximate at least the first end of the cavity; and
    a plurality of light emitting diodes (LEDs) at or proximate to the first end of respective ones of said cavities so as to enable the reflective element of the associated cavity to reflect at least some light emitted from the respective LED, substantially conserving &endue of the light from the respective LED, wherein light from the LED in a given cavity passes through the lens before being output from the lighting apparatus, wherein
    said lens comprises, when viewed in cross section, a main body portion and flare portions extending away from the main body portion and away from the LED in the cavity in which the lens is provided, the main body portion having a curved upper surface, each of the flares including a first profile, a second profile and a third profile, the first profile being parabolic in shape and curving away from the main body portion, the second profile extending upwardly and inwardly from an uppermost part of the first profile, and the third profile extending between an uppermost part of the second profile and an end of the curved upper surface of the main body portion.

13. The apparatus of claim 12, wherein
    each said cavity has a parabolic side wall when viewed in cross section.

14. The apparatus of claim 12, wherein
    the reflective element of each said cavity comprises a thin-film layer.

15. The apparatus of claim 14, further comprising a protective material over the thin-film layer.

16. The apparatus of claim 15, wherein
    the protective material is a polymer, epoxy, resin, or atomic layer deposition (ALD) deposited layer.

17. The apparatus of claim 12, wherein
    each said cavity is a through-hole.

18. The apparatus of claim 12, wherein
    each said cavity is formed to a depth shallower than a depth of the glass substrate.

19. The apparatus of claim 12, further comprising a printed circuit board supporting the plurality of LEDs, the printed circuit board also being mounted on the glass substrate.

20. The apparatus of claim 12, wherein
    each said LED is a chip-on-glass formed LED.

21. The apparatus of claim 12, wherein
    the reflected light exiting the second end of each said cavity is substantially collimated so as to allow for 10-30 degrees of distribution.

22. A lighting system comprising the apparatus of claim 21.

23. A lighting system comprising a plurality of interconnected apparatuses, wherein each said apparatus is the apparatus of claim 21.

* * * * *